United States Patent
Embleton et al.

(10) Patent No.: US 11,644,425 B2
(45) Date of Patent: May 9, 2023

(54) SYSTEM AND METHOD FOR OPTICAL STATE DETERMINATION

(71) Applicant: Dell Products L.P., Hopkinton, MA (US)

(72) Inventors: Steven Embleton, Austin, TX (US); Ben John Sy, Austin, TX (US); Eric Michael Tunks, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 834 days.

(21) Appl. No.: 16/516,370

(22) Filed: Jul. 19, 2019

(65) Prior Publication Data

US 2021/0018445 A1  Jan. 21, 2021

(51) Int. Cl.
| | |
|---|---|
| *H02G 3/08* | (2006.01) |
| *H05K 5/00* | (2006.01) |
| *G01N 21/88* | (2006.01) |
| *H05K 9/00* | (2006.01) |
| *H04B 15/02* | (2006.01) |
| *G06F 1/16* | (2006.01) |

(52) U.S. Cl.
CPC ....... *G01N 21/8803* (2013.01); *G06F 1/1656* (2013.01); *H04B 15/02* (2013.01); *H05K 9/0009* (2013.01); *H05K 9/0018* (2013.01)

(58) Field of Classification Search
CPC  H02G 3/08; H02G 3/081; H05K 5/00; H05K 5/02; H05K 9/00; H05K 9/0009; H05K 9/0007; H05K 9/0018; H05K 7/00; H05K 5/04; H05K 5/0004; H05K 9/0088; G01N 21/8803; G06F 1/1656; H04B 15/02
USPC ......... 174/50, 17 R, 520, 535, 559, 350, 32; 220/3.2, 3.3, 4.02; 361/600, 601, 602, 361/605, 622, 641, 679.01; 356/237.1
See application file for complete search history.

(56) References Cited

U.S. PATENT DOCUMENTS

| | | |
|---|---|---|
| 4,785,136 A | 11/1988 | Mollet et al. |
| 4,858,309 A | 8/1989 | Korsunsky et al. |
| 4,871,220 A | 10/1989 | Kohin |
| 5,049,701 A | 9/1991 | Vowles |
| 5,084,802 A | 1/1992 | Nguyenngoc |
| 5,250,752 A | 10/1993 | Cutright |
| 5,294,748 A | 3/1994 | Schwenk |
| 5,323,298 A | 6/1994 | Shatas |
| 5,343,713 A | 9/1994 | Okabe et al. |
| 5,437,560 A | 8/1995 | Mizuguchi |
| 5,498,968 A | 3/1996 | Kjebon |
| 5,545,844 A | 8/1996 | Plummer, III |
| 5,545,845 A | 8/1996 | Flores |

(Continued)

OTHER PUBLICATIONS

"Full HD Endoscopes"; joimax® GmbH, May 1, 2019; https://web.archive.org/web/20190501003355/https://www.oimax.com/en/products/electronic-devices/hd_endoscopes/.
"JRE 0814 RF Shielded Test Enclosure"; JRE Test, LLC, Apr. 22, 2019; https://web.archive.org/web/20190422094016/https://jretest.com/product/jre-0814/.
"Tapster"; Tapster Robotics, Inc., Sep. 30, 2017; https://web.archive.org/web/20170930111059/https://www.tapster.io/.

(Continued)

*Primary Examiner* — Angel R Estrada
(74) *Attorney, Agent, or Firm* — Chamberlain, Hrdlicka, White, Williams & Aughtry

(57) ABSTRACT

A data processing device includes an internal volume that is electromagnetic interference (EMI) isolated and an optical state detector. The optical state detector obtains electromagnetic radiation from the internal volume while the internal volume is EMI isolated and makes a determination that a device disposed in the internal volume has an optical state associated with the electromagnetic radiation.

16 Claims, 14 Drawing Sheets

(56) References Cited

U.S. PATENT DOCUMENTS

| | | |
|---|---|---|
| 5,649,831 A | 7/1997 | Townsend |
| 5,762,513 A | 6/1998 | Stine |
| 5,812,370 A | 9/1998 | Moore et al. |
| 5,943,218 A | 8/1999 | Liu |
| 6,011,221 A | 1/2000 | Lecinski et al. |
| 6,038,130 A | 3/2000 | Boeck et al. |
| 6,045,385 A | 4/2000 | Kane |
| 6,068,009 A | 5/2000 | Paes |
| 6,087,826 A | 7/2000 | Donath |
| 6,176,727 B1 | 1/2001 | Liu et al. |
| 6,208,514 B1 | 3/2001 | Stark et al. |
| 6,225,554 B1 | 5/2001 | Trehan |
| 6,242,690 B1 | 6/2001 | Glover |
| 6,252,161 B1 | 6/2001 | Hailey et al. |
| 6,269,001 B1 | 7/2001 | Matteson et al. |
| 6,331,940 B1 | 12/2001 | Lin |
| 6,332,792 B1 | 12/2001 | Lin et al. |
| 6,370,036 B1 | 4/2002 | Boe |
| 6,375,361 B1 * | 4/2002 | Falco .................. G02B 6/4277 385/53 |
| 6,377,451 B1 | 4/2002 | Furuya |
| 6,437,987 B1 | 8/2002 | Lin |
| 6,517,369 B1 | 2/2003 | Butterbaugh et al. |
| 6,613,977 B1 | 9/2003 | Fowler |
| 6,657,214 B1 | 12/2003 | Foegelle et al. |
| 6,695,630 B1 | 2/2004 | Ku |
| 6,831,844 B1 * | 12/2004 | Lee ...................... H05K 9/0062 361/752 |
| 6,870,092 B2 | 3/2005 | Lambert et al. |
| 6,947,290 B2 | 9/2005 | Hirata |
| 7,035,087 B2 | 4/2006 | Tan |
| 7,075,796 B1 | 7/2006 | Pritchett |
| 7,133,296 B2 | 11/2006 | Choi et al. |
| 7,287,996 B1 | 10/2007 | Shing |
| 7,371,097 B1 | 5/2008 | Pennypacker et al. |
| 7,371,977 B1 | 5/2008 | Preonas |
| 7,692,934 B2 | 4/2010 | Bartscher et al. |
| 7,695,313 B2 | 4/2010 | Karim et al. |
| 7,757,847 B2 | 7/2010 | Tang et al. |
| 8,059,414 B2 | 11/2011 | Wei |
| 8,098,492 B2 | 1/2012 | Rosenberg et al. |
| 8,243,469 B2 | 8/2012 | Jaze et al. |
| 8,310,834 B2 | 11/2012 | Fürholzer |
| 8,508,956 B2 | 8/2013 | Nicol |
| 8,530,756 B1 | 9/2013 | Winch |
| 8,636,526 B2 | 1/2014 | Funamura et al. |
| 8,642,900 B2 | 2/2014 | Nordling |
| 8,662,295 B2 | 3/2014 | Kubota et al. |
| 8,687,374 B2 | 4/2014 | Watanabe et al. |
| 8,720,682 B2 | 5/2014 | Navon et al. |
| 8,760,859 B2 | 6/2014 | Fuchs |
| 8,969,738 B2 | 3/2015 | Ross |
| 9,019,711 B2 | 4/2015 | Tamura |
| 9,095,045 B2 | 7/2015 | Rojo |
| 9,370,132 B2 | 6/2016 | Coppola |
| 9,497,894 B1 | 11/2016 | Ramsey |
| 9,549,480 B1 | 1/2017 | Besterman |
| 9,585,270 B2 | 2/2017 | Yang et al. |
| 9,603,280 B2 | 3/2017 | Frank et al. |
| 9,607,660 B2 | 3/2017 | Bennett, II et al. |
| 9,640,910 B1 | 5/2017 | Chien et al. |
| 9,642,290 B2 | 5/2017 | Anderson |
| 9,696,410 B1 | 7/2017 | Lee et al. |
| 9,820,404 B2 | 11/2017 | Wu et al. |
| 9,829,939 B1 | 11/2017 | Lien et al. |
| 9,930,816 B2 | 3/2018 | Winch |
| 10,007,309 B1 | 6/2018 | Imwalle |
| 10,249,984 B1 | 4/2019 | Rask |
| 10,364,031 B2 | 7/2019 | Goupil |
| 10,420,258 B1 | 9/2019 | Rahilly |
| 10,477,740 B2 | 11/2019 | Coppola |
| 10,477,741 B1 | 11/2019 | Bae |
| 10,492,324 B2 | 11/2019 | Miura |
| 10,520,532 B2 | 12/2019 | Lee |
| 10,541,519 B1 | 1/2020 | Wavering |
| 10,542,642 B2 | 1/2020 | Babhadiashar |
| 10,575,443 B2 | 2/2020 | Woodbury, II |
| 10,638,634 B1 | 4/2020 | Elsasser |
| 10,707,636 B2 | 7/2020 | Yamamoto |
| 10,720,722 B2 | 7/2020 | Tsomg et al. |
| 10,734,763 B2 | 8/2020 | M R et al. |
| 10,917,996 B1 * | 2/2021 | Embleton ............ H05K 9/0062 |
| 10,980,159 B2 | 4/2021 | Embleton et al. |
| 11,143,682 B2 * | 10/2021 | Embleton ............ G06F 11/3006 |
| 11,513,934 B2 * | 11/2022 | Embleton ............... G06F 1/182 |
| 2002/0000645 A1 | 1/2002 | Sato et al. |
| 2002/0001181 A1 | 1/2002 | Kondo |
| 2002/0027769 A1 | 3/2002 | Kasahara et al. |
| 2002/0064035 A1 | 5/2002 | Mair |
| 2003/0011988 A1 | 1/2003 | Irmer |
| 2003/0042990 A1 | 3/2003 | Schumacher |
| 2003/0057131 A1 | 3/2003 | Diaferia |
| 2003/0137811 A1 | 7/2003 | Ling et al. |
| 2003/0174474 A1 | 9/2003 | Mair |
| 2003/0174487 A1 | 9/2003 | Garmong |
| 2003/0192715 A1 | 10/2003 | Lambert et al. |
| 2004/0001299 A1 | 1/2004 | Van Haaster et al. |
| 2004/0020674 A1 | 2/2004 | Mcfadden et al. |
| 2005/0247471 A1 | 11/2005 | Archambeault |
| 2006/0025010 A1 | 2/2006 | Spitaels et al. |
| 2007/0105445 A1 | 5/2007 | Manto et al. |
| 2007/0145699 A1 | 6/2007 | Robbins |
| 2007/0147013 A1 | 6/2007 | Robbins |
| 2007/0151779 A1 | 7/2007 | Robbins |
| 2008/0076291 A1 | 3/2008 | Ewing et al. |
| 2009/0021925 A1 | 1/2009 | Heimann |
| 2009/0095523 A1 | 4/2009 | Stevenson |
| 2009/0146862 A1 | 6/2009 | Malone |
| 2010/0117579 A1 | 5/2010 | Culbert |
| 2010/0208433 A1 | 8/2010 | Heimann |
| 2010/0270299 A1 | 10/2010 | Baltussen |
| 2010/0285636 A1 | 11/2010 | Chen |
| 2010/0319981 A1 | 12/2010 | Kapusta et al. |
| 2011/0011760 A1 | 1/2011 | Habersetzer |
| 2011/0198245 A1 | 8/2011 | Soufan |
| 2011/0222249 A1 | 9/2011 | Ruehl et al. |
| 2011/0232956 A1 | 9/2011 | Ramsey |
| 2012/0011700 A1 | 1/2012 | Kelaher et al. |
| 2012/0044653 A1 | 2/2012 | Morris et al. |
| 2012/0073873 A1 | 3/2012 | Nash |
| 2012/0116590 A1 | 5/2012 | Florez-Iarrahondo |
| 2012/0178364 A1 | 7/2012 | Dobyns |
| 2012/0285738 A1 | 11/2012 | Cochrane et al. |
| 2013/0032310 A1 | 2/2013 | Jaena et al. |
| 2013/0065454 A1 | 3/2013 | Milbrand, Jr. |
| 2013/0160563 A1 | 6/2013 | Dingler et al. |
| 2013/0194772 A1 | 8/2013 | Rojo |
| 2013/0206470 A1 | 8/2013 | Davis |
| 2013/0258582 A1 | 10/2013 | Shelnutt |
| 2013/0277520 A1 | 10/2013 | Funk et al. |
| 2014/0008119 A1 | 1/2014 | Brandt |
| 2014/0138388 A1 | 5/2014 | Synnestvedt |
| 2014/0368821 A1 | 12/2014 | Gazaway et al. |
| 2015/0014912 A1 | 1/2015 | Ivey et al. |
| 2015/0245529 A1 | 8/2015 | Tam et al. |
| 2015/0257310 A1 | 9/2015 | Desouza |
| 2015/0271959 A1 | 9/2015 | Chen et al. |
| 2015/0368423 A1 | 12/2015 | Yamauchi et al. |
| 2015/0373869 A1 | 12/2015 | Macerini et al. |
| 2016/0081231 A1 | 3/2016 | Berke |
| 2016/0098561 A1 | 4/2016 | Keller et al. |
| 2016/0111814 A1 | 4/2016 | Hirano et al. |
| 2016/0159480 A1 | 6/2016 | Barth |
| 2016/0182130 A1 | 6/2016 | Ahmed et al. |
| 2016/0372948 A1 | 12/2016 | Kvols |
| 2016/0381818 A1 | 12/2016 | Mills |
| 2017/0049011 A1 | 2/2017 | Durant et al. |
| 2017/0071063 A1 | 3/2017 | Sizemore |
| 2017/0181314 A1 | 6/2017 | Leigh et al. |
| 2017/0347496 A1 | 11/2017 | Smith |
| 2018/0062287 A1 | 3/2018 | Shaw et al. |
| 2018/0249600 A1 | 8/2018 | Coppola |

(56) References Cited

U.S. PATENT DOCUMENTS

| | | |
|---|---|---|
| 2018/0257334 A1 | 9/2018 | Motoyanagi et al. |
| 2019/0008079 A1 | 1/2019 | Kondo et al. |
| 2019/0050030 A1 | 2/2019 | Baum |
| 2019/0056439 A1 | 2/2019 | Lee |
| 2019/0159371 A1 | 5/2019 | Grinsteinner |
| 2019/0230828 A1 | 7/2019 | Murch |
| 2019/0254191 A1 | 8/2019 | Chang et al. |
| 2019/0304922 A1 | 10/2019 | Maruthamuthu et al. |
| 2019/0320796 A1 | 10/2019 | Ding |
| 2019/0353356 A1 | 11/2019 | Fischer |
| 2019/0364701 A1 | 11/2019 | Rahilly et al. |
| 2019/0379183 A1 | 12/2019 | Winsor |
| 2020/0187394 A1 | 6/2020 | Murugesan |
| 2020/0187578 A1 | 6/2020 | Sadato |
| 2020/0313584 A1 | 10/2020 | Morel et al. |
| 2021/0022277 A1 | 1/2021 | Embleton et al. |

OTHER PUBLICATIONS

Gary Fenical; "Rule-of-Thumb for Calculating Aperture Size"; Laird Technologies; Mar. 2003 (http://cdn.lairdtech.com/home/brandworld/files/EMI%20Rule-of-Thumb%20for%20Calculating%20Aperture%20Size%20Technical%20Note%20Download.pdf).

David G. Wang, James L. Knighten, And P. Keith Muller, An Integrated Vent, Heatsink and EMI Shield, An Integrated Vent, Heatsink and EMI Shield, 2002, pp. 1-7, 2002 (7 pages).

David Zhou, Ming Zhang, Chris Du, Enhancing Rack Servers Air Cooling Capability with Extra System Inlet Airflow through Air Ducts between Racks, Enhancing Rack Servers Air Cooling Capability with Extra System Inlet Airflow through Air Ducts between Racks, 2017, pp. 1-7, 2017 (7 pages).

Yuchang Qing et al., "Microwave-absorbing and mechanical properties of carbonyl-iron/epoxy-silicone resin coatings", Jul. 16, 2008, Journal of Magnetism and Magnetic Materials, vol. 321 Issue 1, pp. 25-28 (Year: 2008).

\* cited by examiner

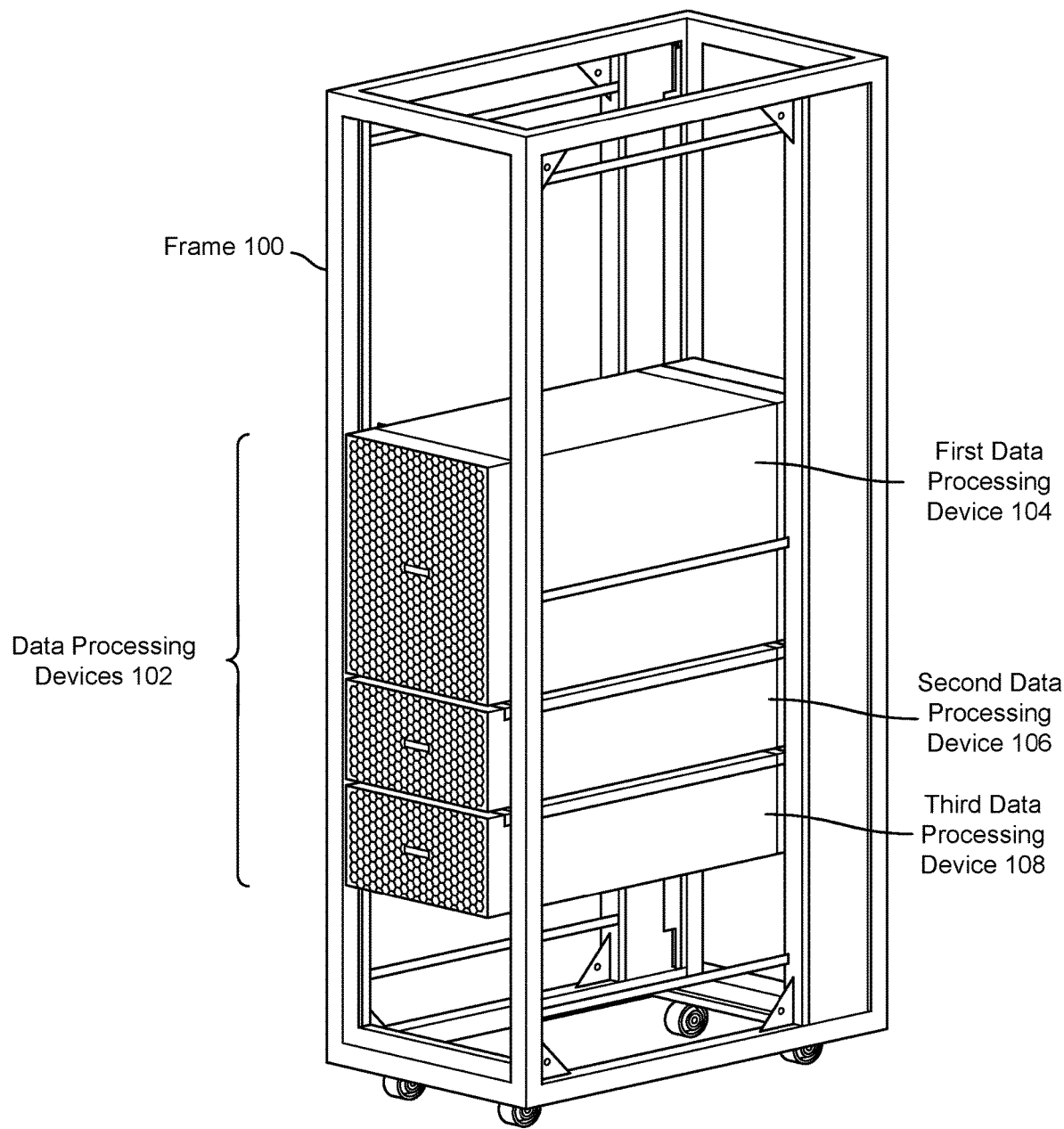
FIG. 1.1

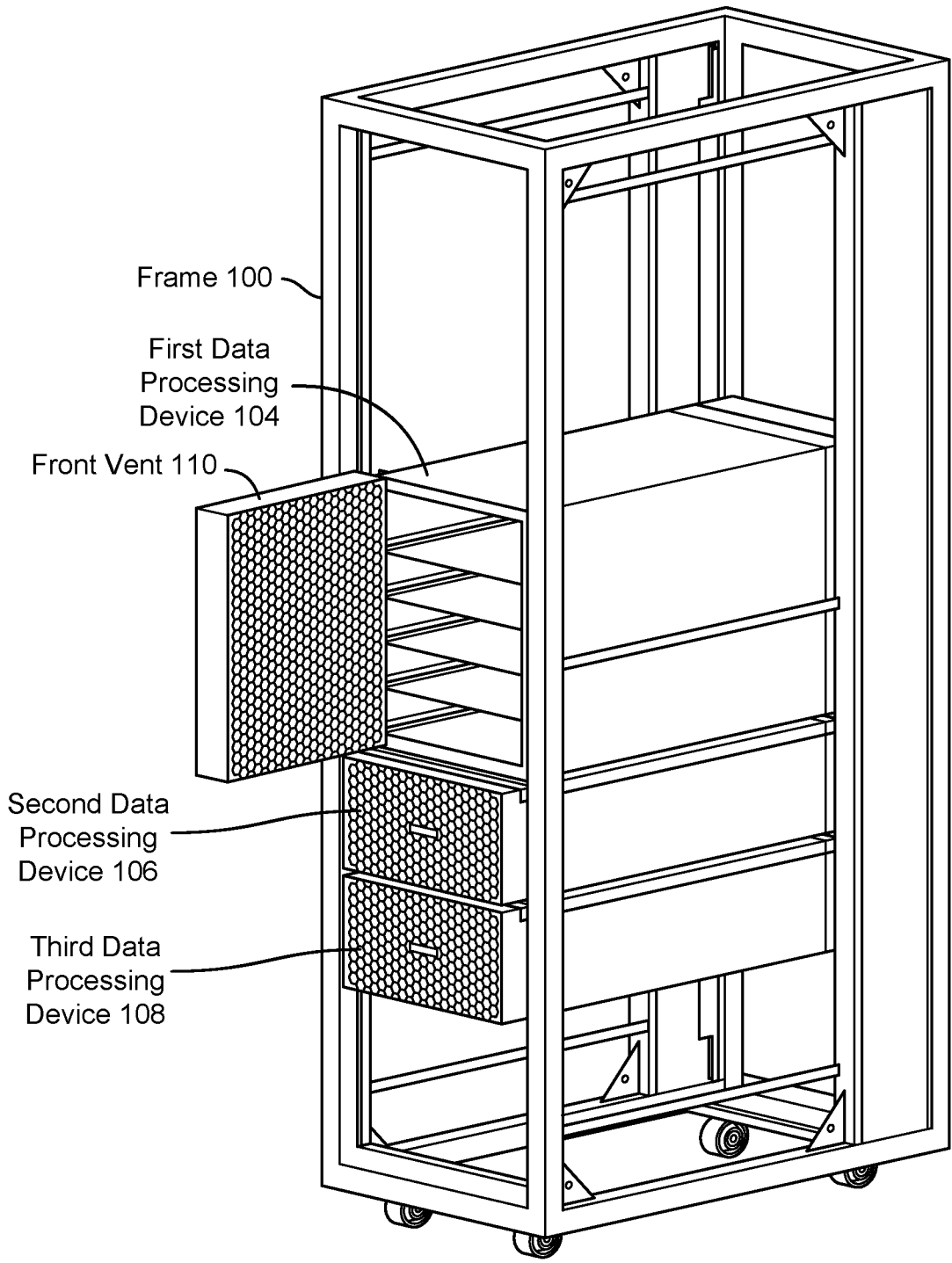
FIG. 1.2

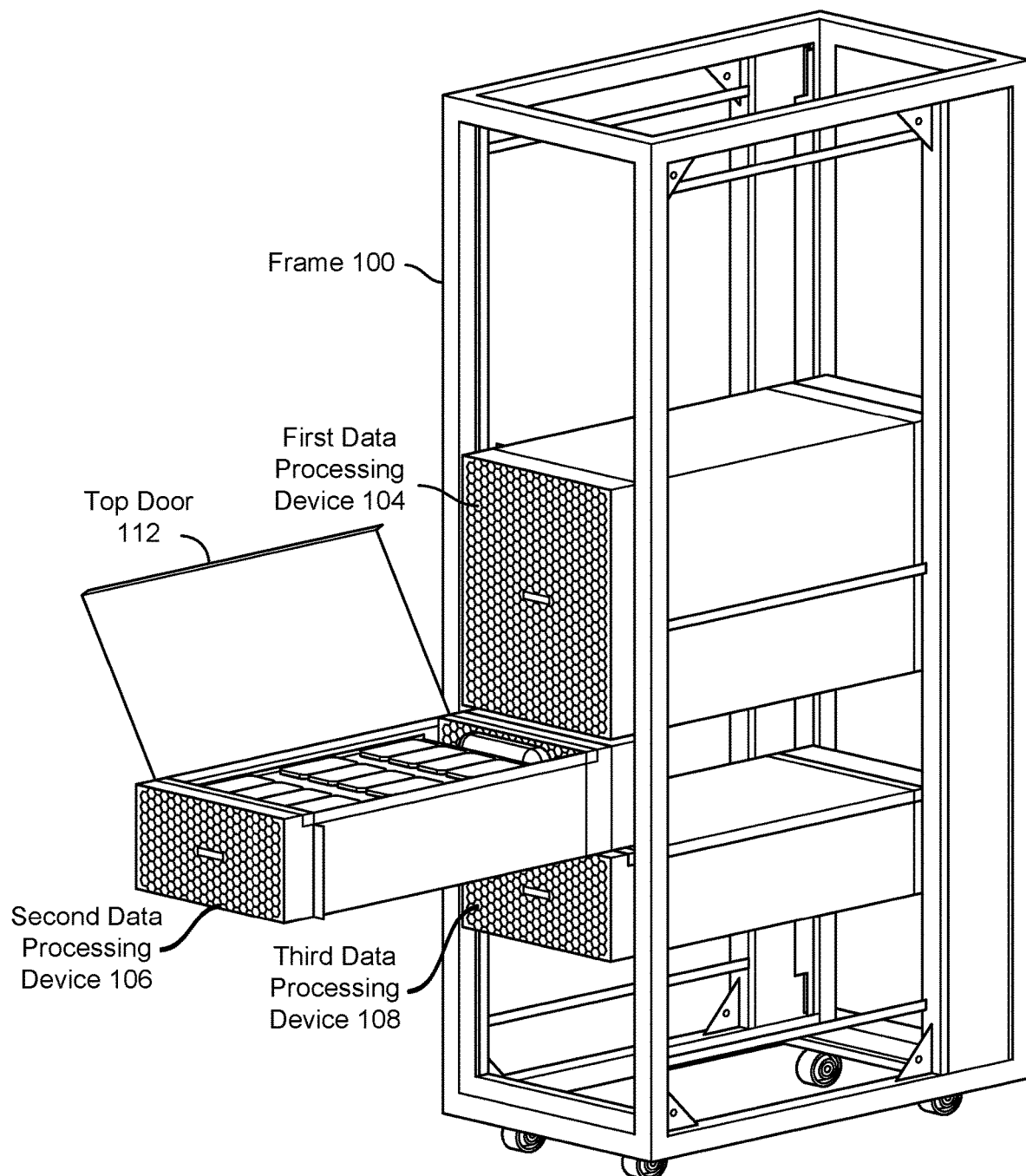
FIG. 1.3

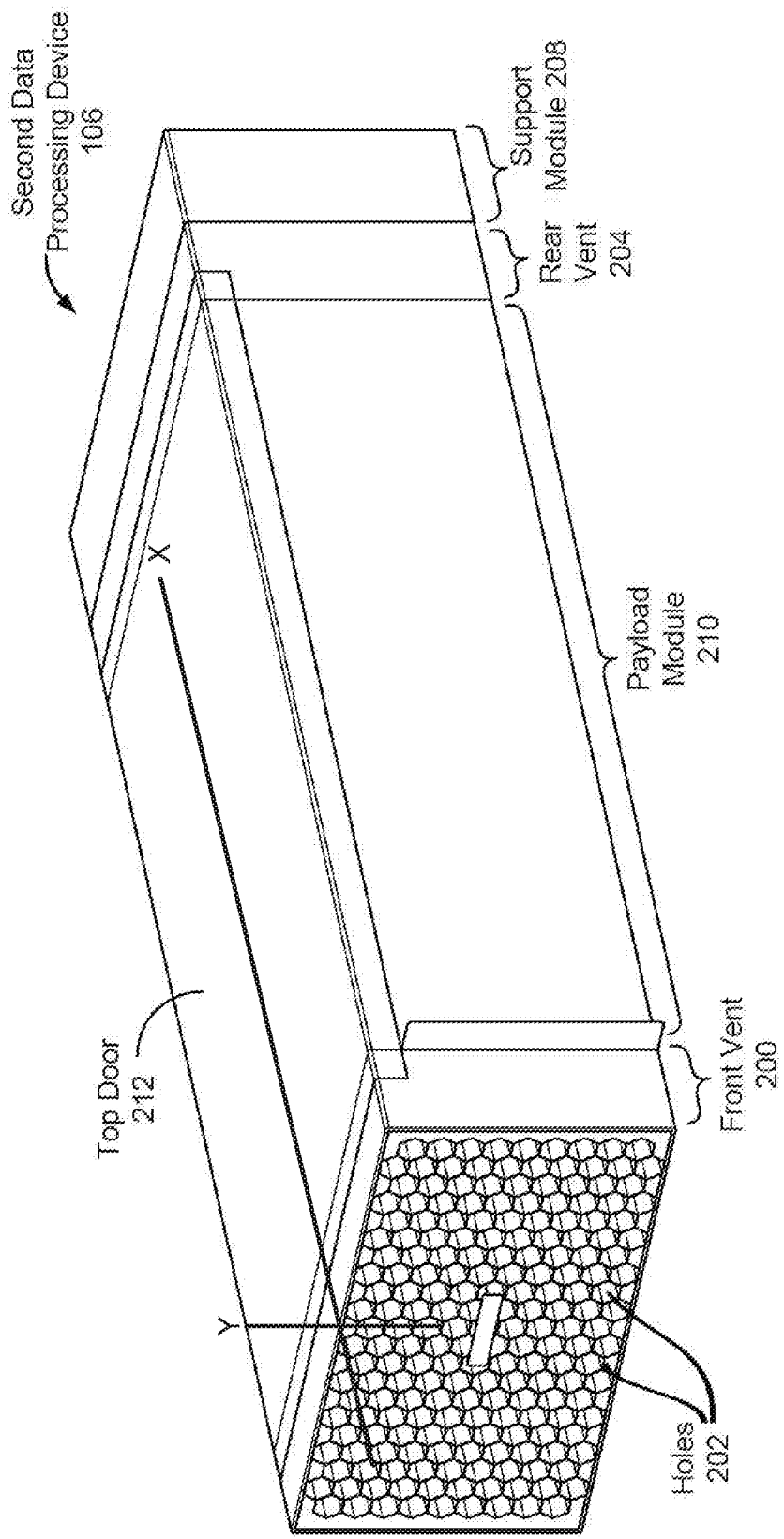
FIG. 2.1

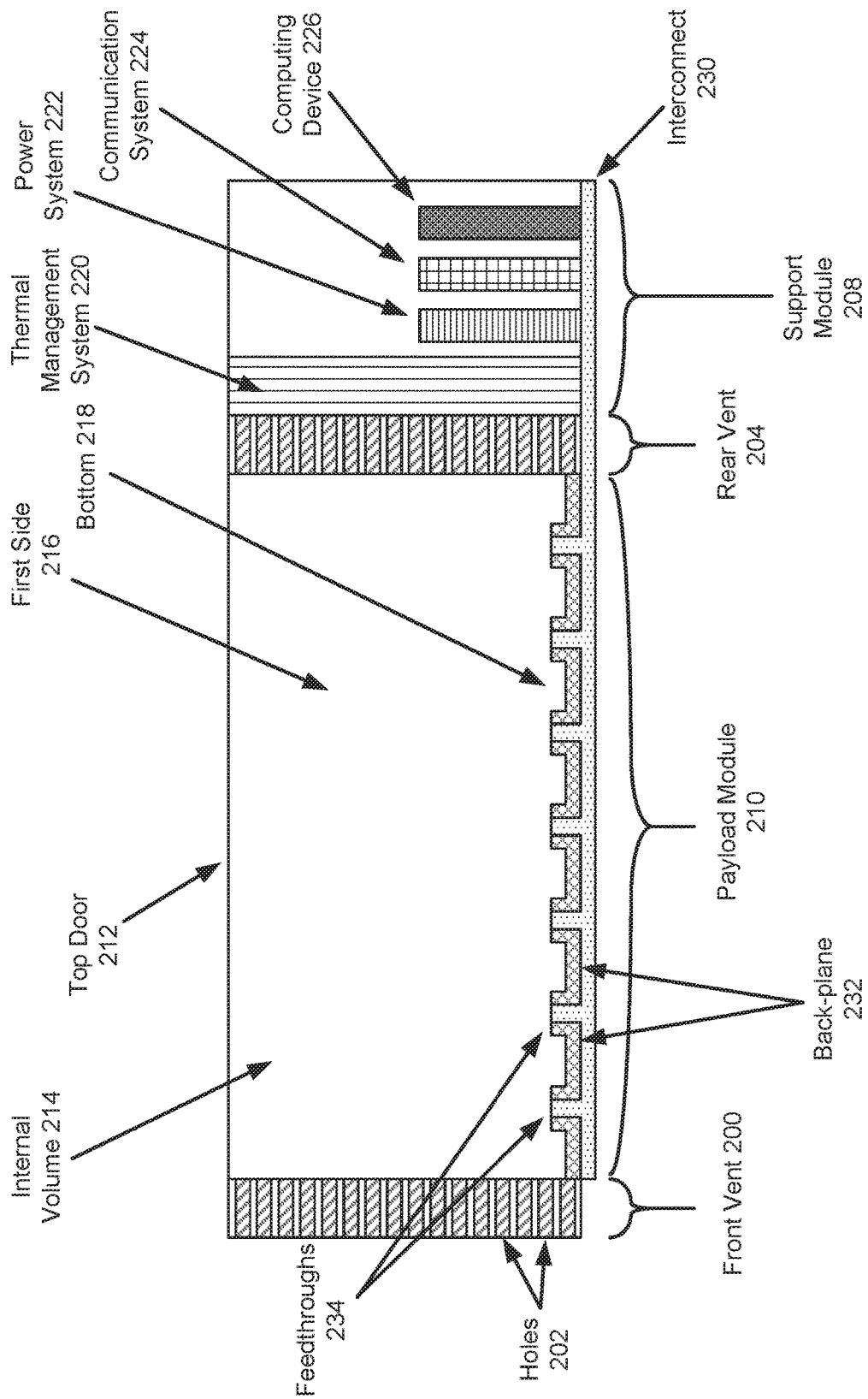
FIG. 2.2

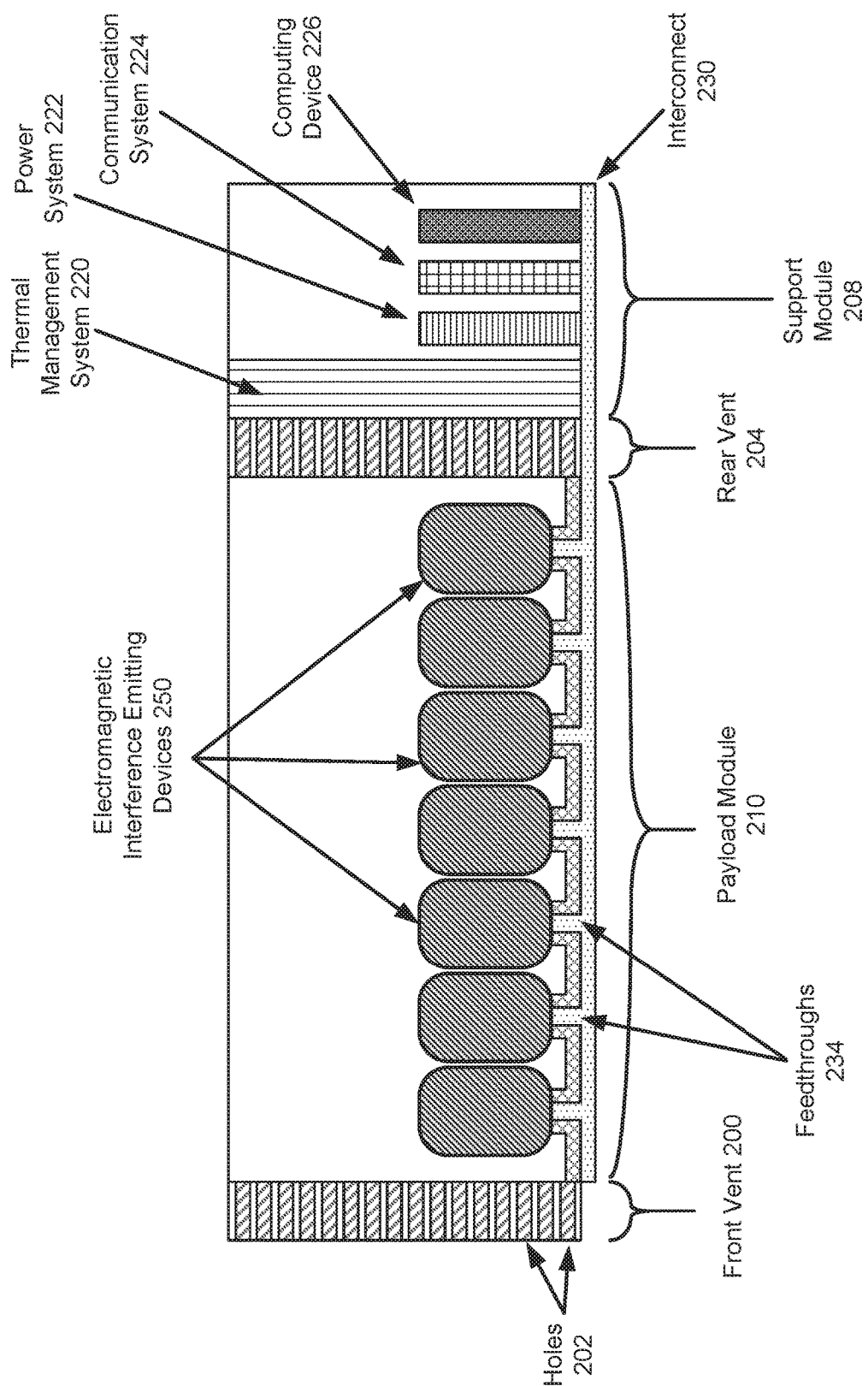
FIG. 2.3

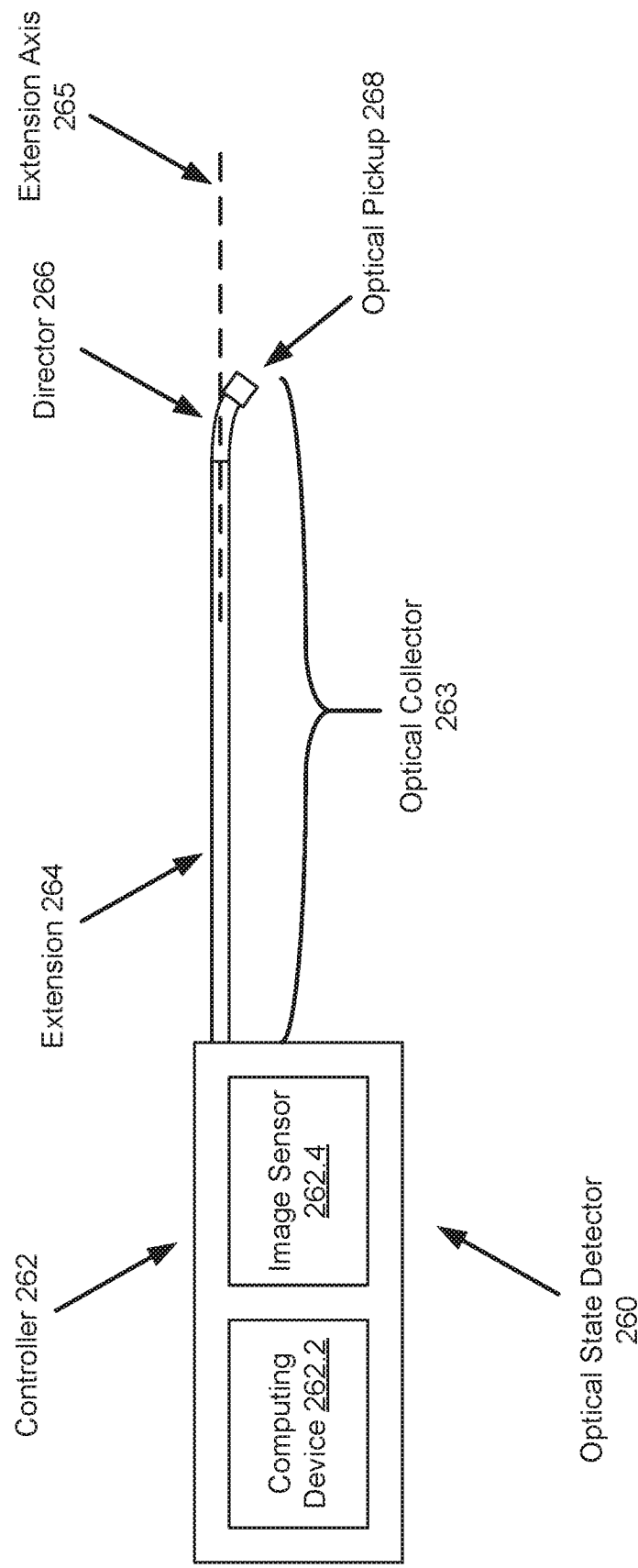
FIG. 2.4

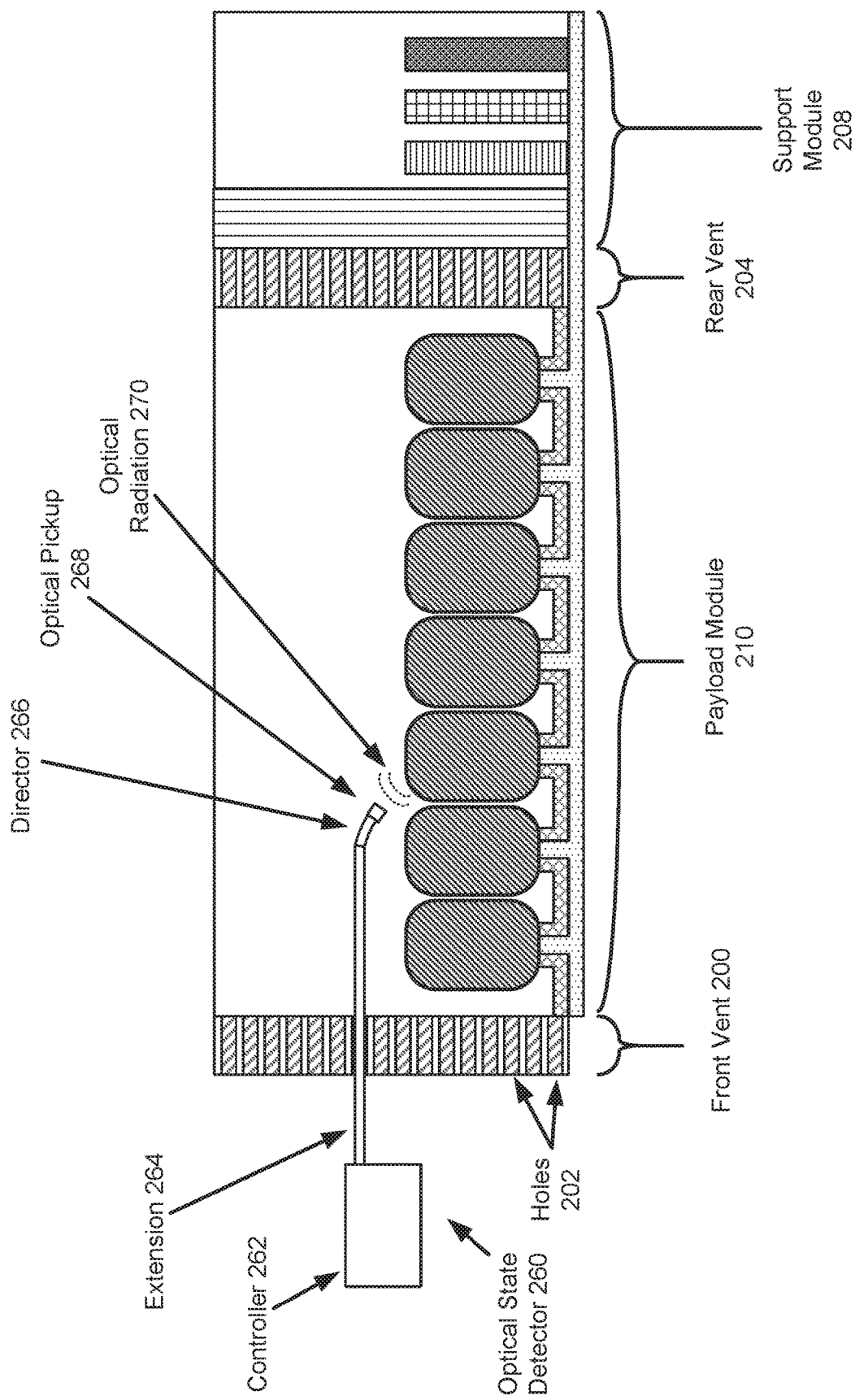
FIG. 2.5

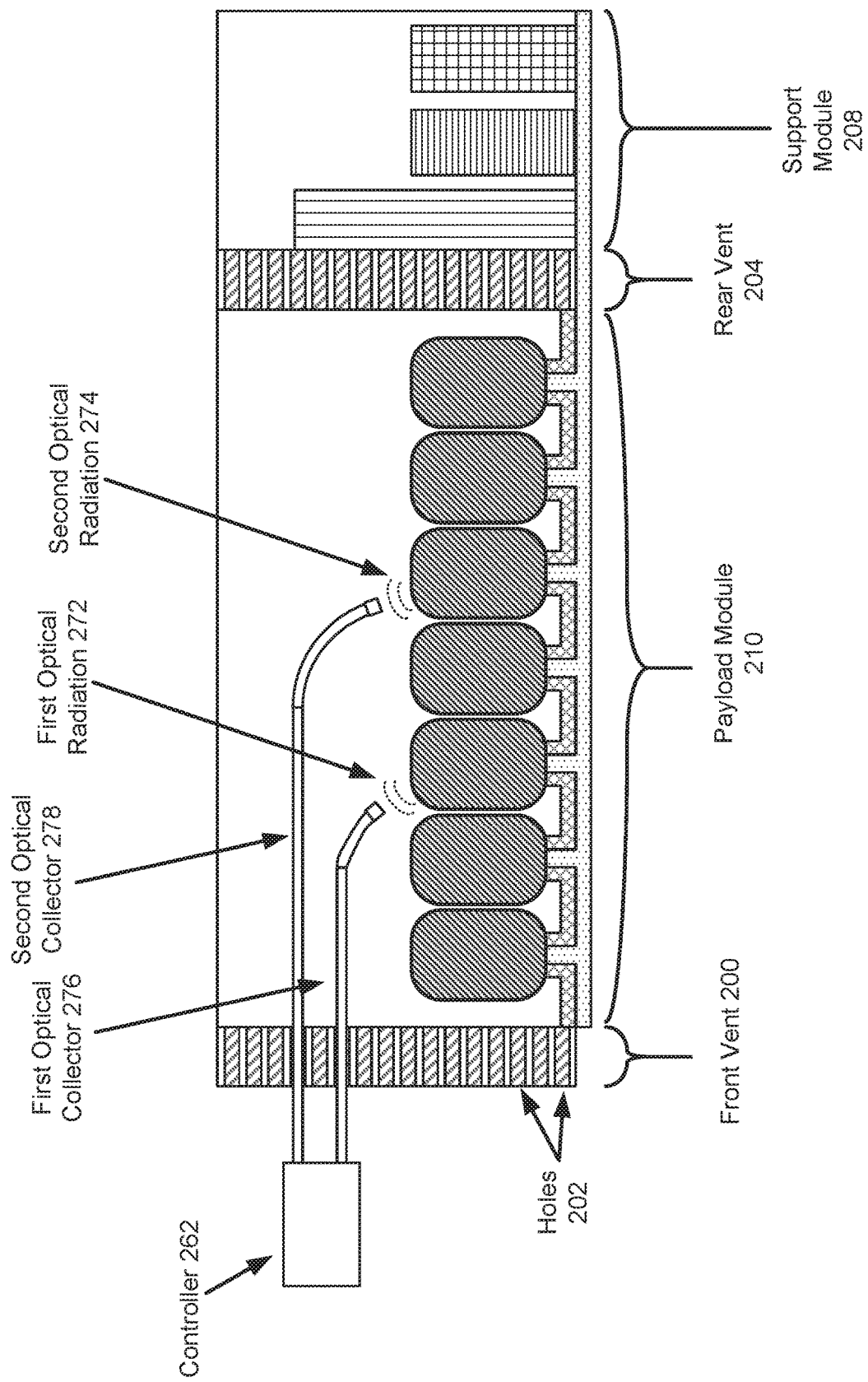
FIG. 2.6

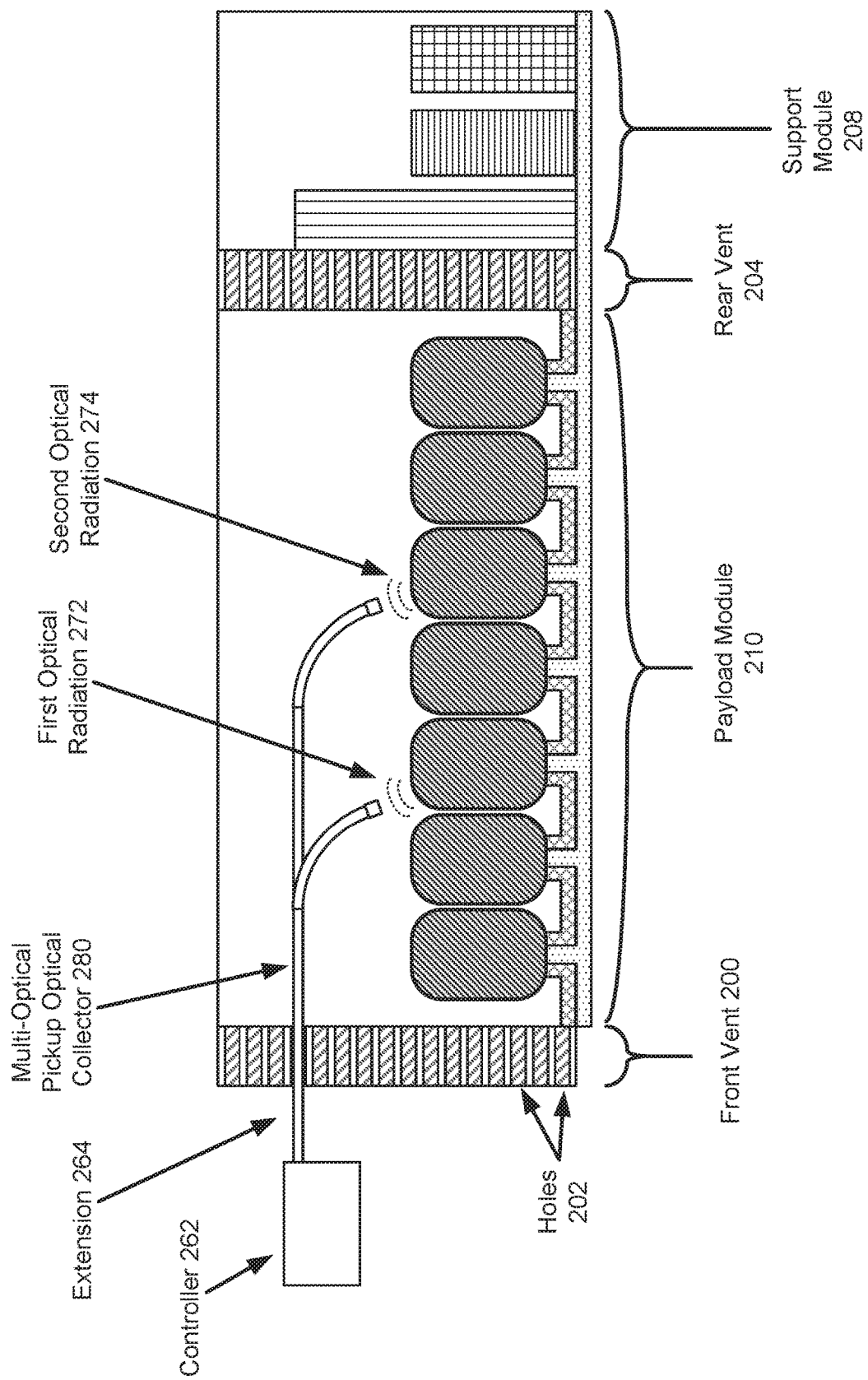
FIG. 2.7

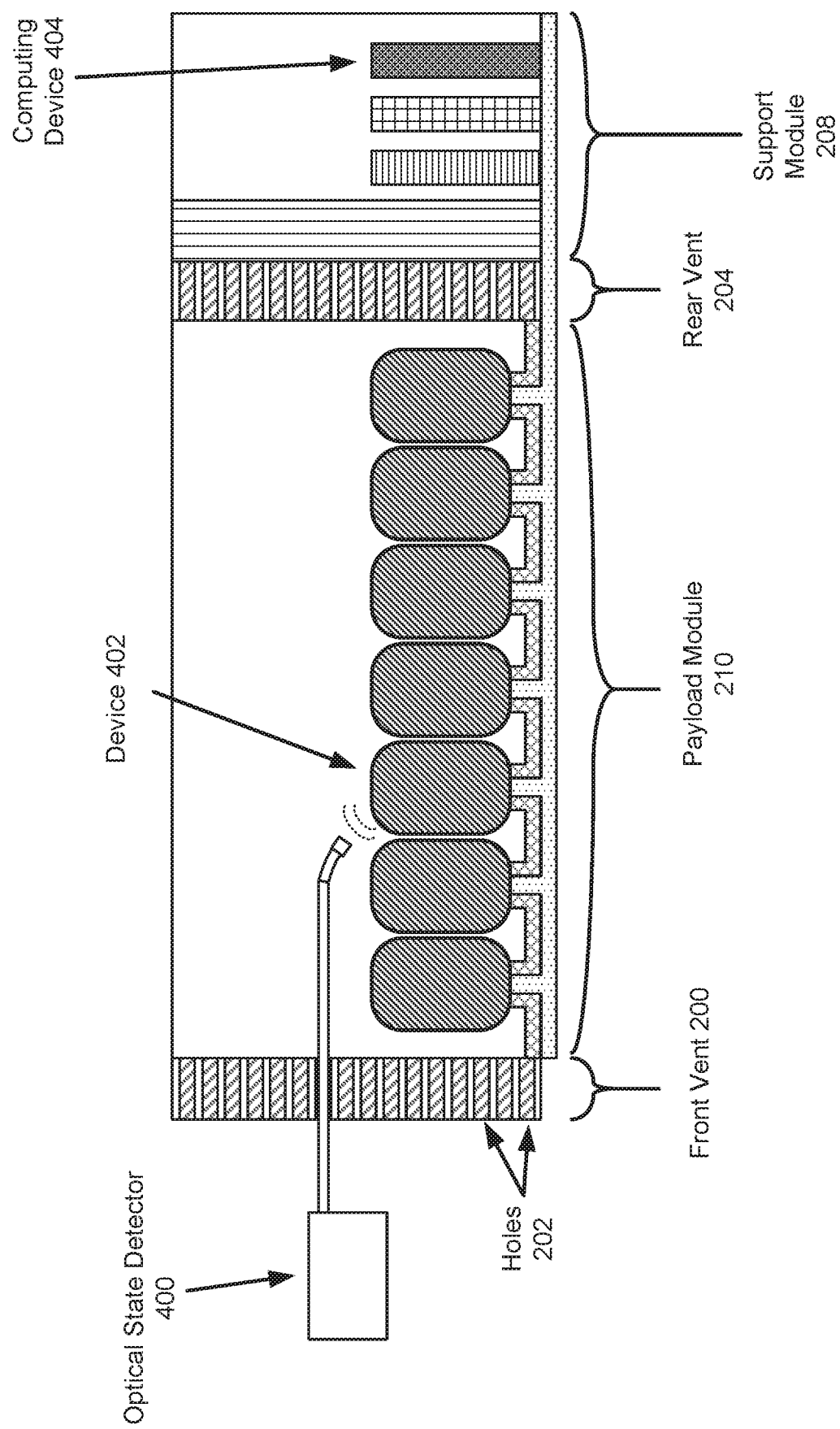
FIG. 4.1

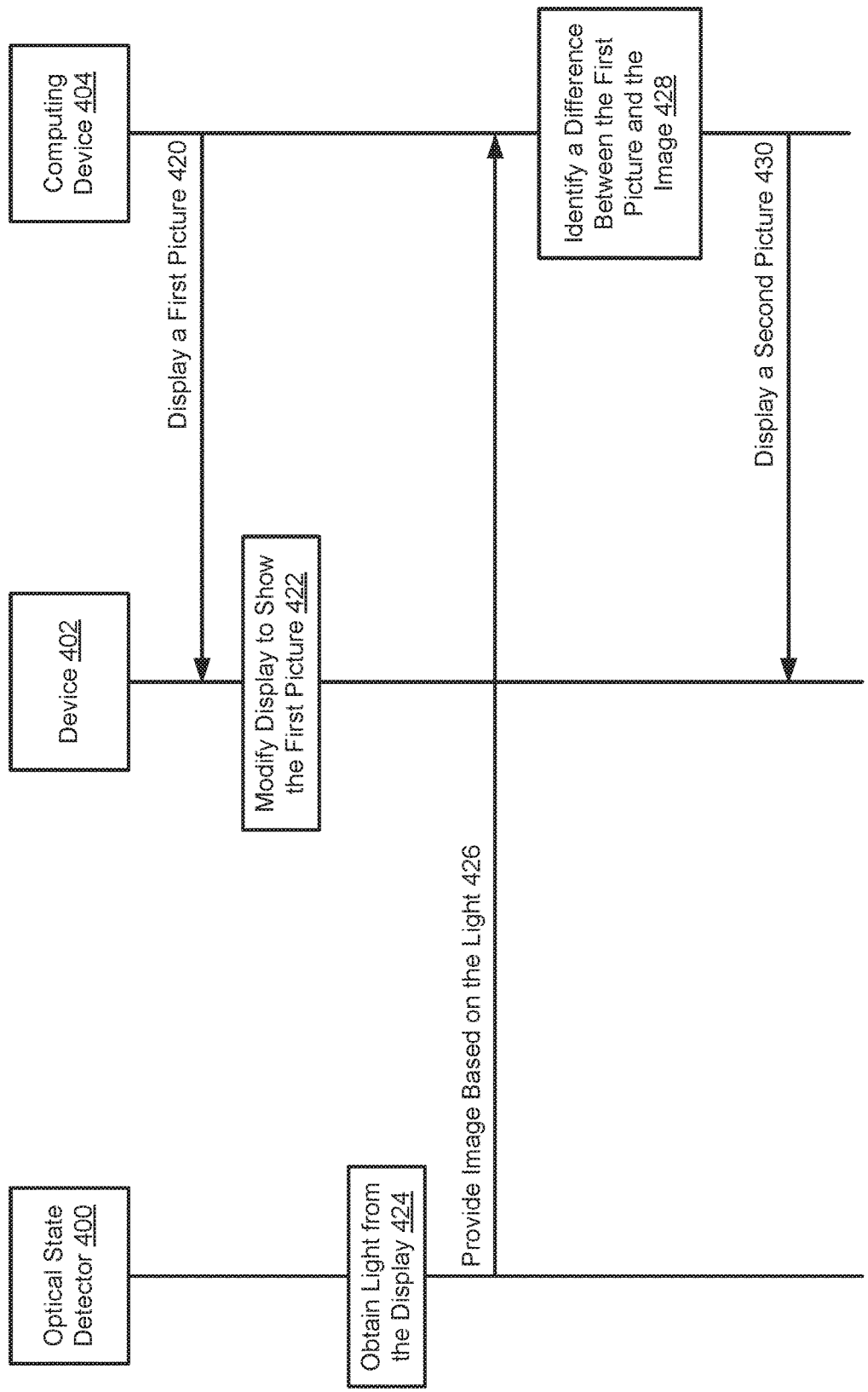
FIG. 4.2

SYSTEM AND METHOD FOR OPTICAL STATE DETERMINATION

BACKGROUND

High density environment may include devices that are tightly packed together. In other words, the devices may be physically close to each other. Such an environment presents numerous challenges relating to thermal management, mechanical positioning and orienting of devices, and electrical concerns related to power and operation of such devices.

SUMMARY

In one aspect, a data processing device in accordance with one or more embodiments of the invention includes an internal volume that is electromagnetic interference (EMI) isolated and an optical state detector. The optical state detector obtains electromagnetic radiation from the internal volume while the internal volume is EMI isolated and makes a determination that a device disposed in the internal volume has an optical state associated with the electromagnetic radiation.

In one aspect, a method for managing electromagnetic interference (EMI) in accordance with one or more embodiments of the invention includes obtaining electromagnetic radiation from a device, disposed in an internal volume of a data processing device, while the internal volume is EMI isolated and after the device performs a function; making a determination that the device disposed in the internal volume has an optical state associated with the electromagnetic radiation; and performing a first action set based on the determination. The electromagnetic radiation is obtained through a boundary of the internal volume.

In one aspect, a non-transitory computer readable medium in accordance with one or more embodiments of the invention includes instructions that when executed by a data processing device cause the data processing device to perform a method for managing electromagnetic interference (EMI), the method includes obtaining electromagnetic radiation from a device, disposed in an internal volume of a data processing device, while the internal volume is EMI isolated and after the device performs a function; making a determination that the device disposed in the internal volume has an optical state associated with the electromagnetic radiation; and performing a first action set based on the determination. The electromagnetic radiation is obtained through a boundary of the internal volume.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an example system in accordance with one or more embodiments of the invention.

FIG. 1.2 shows a diagram of the example system of FIG. 1.1 in a first configuration in accordance with one or more embodiments of the invention.

FIG. 1.3 shows a diagram of the example system of FIG. 1.1 in a second configuration in accordance with one or more embodiments of the invention.

FIG. 2.1 shows a diagram of a second data processing device in accordance with one or more embodiments of the invention.

FIG. 2.2 shows a first cross section diagram of the data processing device of FIG. 2.1.

FIG. 2.3 shows a second cross section diagram of the data processing device of FIG. 2.1 in accordance with one or more embodiments of the invention.

FIG. 2.4 shows a diagram of an optical state detector in accordance with one or more embodiments of the invention.

FIG. 2.5 shows a third cross section diagram of the data processing device of FIG. 2.1 in accordance with one or more embodiments of the invention.

FIG. 2.6 shows a fourth cross section diagram of the data processing device of FIG. 2.1 in accordance with one or more embodiments of the invention.

FIG. 2.7 shows a fifth cross section diagram of the data processing device of FIG. 2.1 in accordance with one or more embodiments of the invention.

FIG. 4.1 shows a diagram of an example system.

FIG. 4.2 shows a diagram of actions performed by the example system of FIG. 4.1.

DETAILED DESCRIPTION

Figure 3:
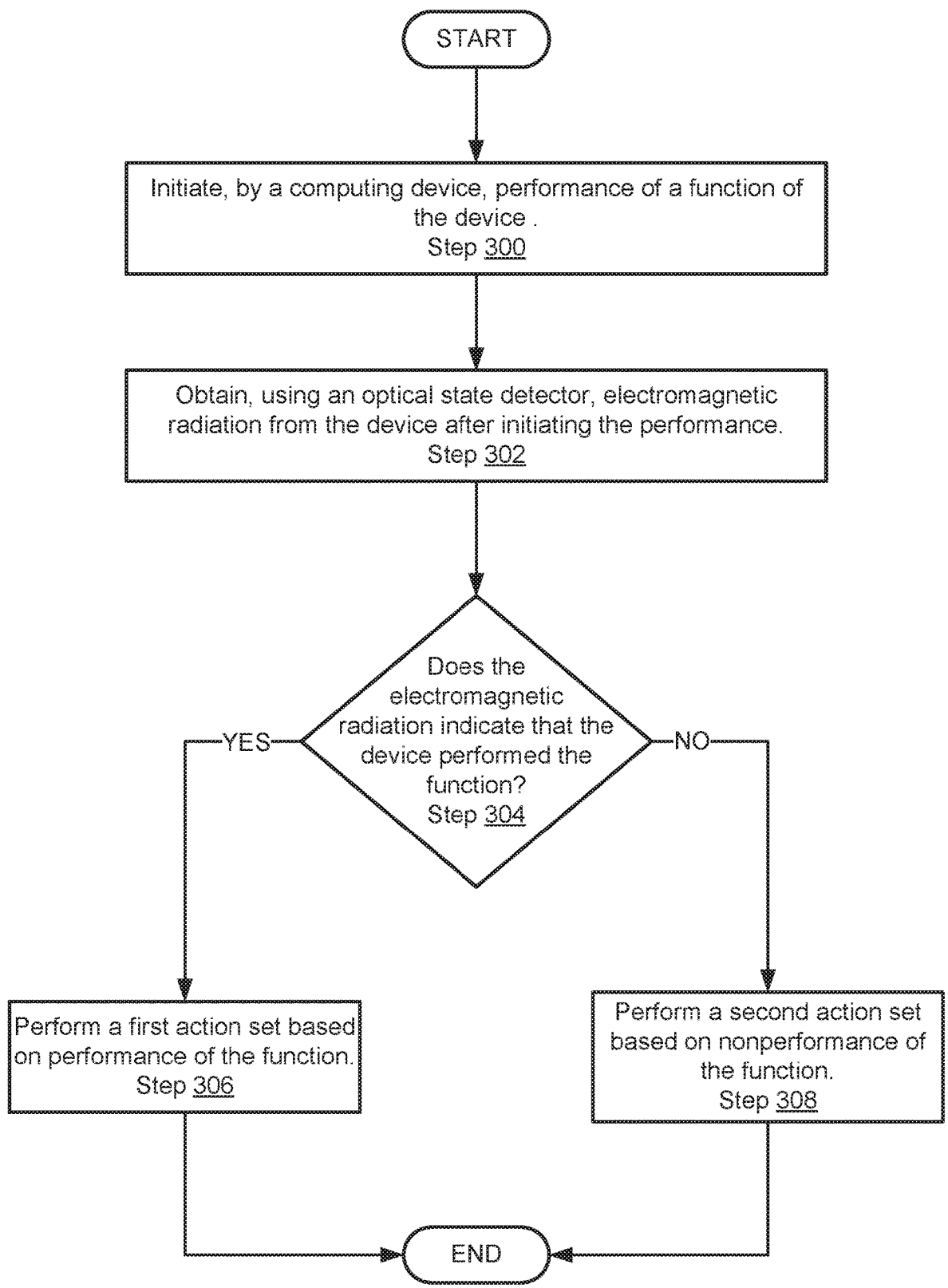
FIG. 3 shows a flowchart of a method of managing devices disposed in a data processing device in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing electromagnetic interference in a high-density environment. Specifically, embodiments of the invention may provide a system that manages electromagnetic interference at a data processing device level. By doing so, embodiments of the invention may facilitate the inclusion of electromagnetic interference emitting devices in a high-density environment while mitigating the impact of electromagnetic interference generated by the electromagnetic interference emitting devices.

In one or more embodiments of the invention, a data processing device includes an optical state detector. The optical state detector may enable optical states of devices disposed in a data processing device to be determined while the electromagnetic interference generated by such devices is contained within the data processing device. The optical states may be used to improve the accuracy of operational state determinations of the data processing devices when compared to determination of operational states made without optical state information for the devices.

In one or more embodiments of the invention, the operational states of the devices disposed in the data processing device is used to determine future actions to be performed by the devices. For example, the operational states of the devices may be used to determine whether to repeatedly invoke functionality of the devices or to invoke different functionalities of the devices. The operational states of the devices may be used for other purposes without departing from the invention.

FIG. 1.1 shows an example system in accordance with one or more embodiments of the invention. The system may include a frame (100) and any number of data processing devices (102). The components of the example system may provide electromagnetic interference management services for devices disposed within the data processing devices (102). By doing so, devices that emit electromagnetic interference may be utilized in a high-density computing environment without negatively impacting the high-density computing environment.

For example, one or more electromagnetic interference emitting devices may be disposed within one or more of the data processing devices (102). The system illustrated in FIG. 1.1 may manage the electromagnetic interference generated by the one or more electromagnetic interference emitting devices by (i) limiting the space in which electromagnetic interference is allowed to freely propagate and/or (ii) attenuating the electromagnetic interference as it propagates out of the limited space.

To do so, the system of FIG. 1.1 may reduce the strength of the electromagnetic interference when propagating from inside of a portion of the data processing devices (102) to an ambient environment (or other portions of the data processing devices (102)) around the data processing devices (102) and/or other locations by at least 90 decibels.

For example, a data processing device in accordance with embodiments of the invention may provide greater than 35 decibels of isolation, between 35-50 decibels of isolation, between 50-65 decibels of isolation, between 65-80 decibels of isolation, and/or greater than 80 decibels of isolation.

The electromagnetic interference isolation provided by the data processing devices (102) may have a frequency dependent response. For example, the data processing devices (102) may provide at least 90 decibels (dB), or another suitable level of isolation, across a frequency band in which devices that may be disposed within the data processing devices (102) are adapted to emit electromagnetic interference. In other frequency bands, the data processing devices (102) may provide different level or no electromagnetic interference isolation for devices disposed within the data processing devices (102).

Accordingly, a data processing device in accordance with one or more embodiments of the invention may provide electromagnetic interference suppression services that are frequency dependent. In one or more embodiments of the invention, a data processing device provides electromagnetic interference isolation by reducing the strength of electromagnetic interference across at least one frequency band by a predetermined amount (e.g., 90 decibels).

An electromagnetic interference emitting device may be any type of hardware device that intentionally emits electromagnetic radiation as part of its operation. The emissions of electromagnetic radiation may be, for example, continuous, periodic, or intermittent (e.g., at any point in time based on the operation of the respective electromagnetic interference emitting device). An electromagnetic interference emitting device may be, for example, a personal electronic device such as a cellular device (e.g., smart phone, cell phone, etc.), a personal computer (e.g., any type of computing device with wireless communication capabilities such as a tablet computer, a laptop computer, etc.), a watch (e.g., a wireless smart watch), or any other type of hardware device that intentionally emits electromagnetic radiation for any purpose (e.g., communications, detection, etc.).

The electromagnetic interference emitted by an electromagnetic interference emitting device may be frequency dependent. That is, the electromagnetic interference emitted by the electromagnetic interference emitting device may be stronger in a first frequency band and weaker in a second frequency band. To provide electromagnetic interference suppression services, a data processing device in accordance with one or more embodiments of the invention may attenuate the electromagnetic interference emitted by an electromagnetic interference emitting device by at least a predetermined amount (e.g., 80 decibels) across at least one frequency band in which the electromagnetic interference emitting device emits electromagnetic interference. The at least one frequency band may be, for example, the frequency band in which the emitted electromagnetic interference has a largest magnitude.

In one or more embodiments of the invention, an electromagnetic interference emitting device emits electromagnetic interference having frequency content between 700 megahertz and 10 gigahertz. An electromagnetic interference emitting device may emit electromagnetic interference having different frequency content without departing from the invention.

Additionally, the example system of FIG. 1.1 may provide optical state monitoring services for devices disposed within the data processing devices (102). The optical state monitoring services may be provided to the devices while the devices are electromagnetically isolated from other devices by being disposed inside of the data processing devices (102). By monitoring the optical states of the devices, other state information (e.g., operating state of the devices) may be determined based on the monitored optical states of the devices. For additional details regarding components of the system that may facilitate the optical state monitoring services, refer to FIGS. 2.3-2.7.

To further discuss aspects of embodiments of the disclosed technology, each component of the system of FIG. 1.1 is discussed below.

In one or more embodiments of the invention, the frame (100) is a physical structure. The physical structure may be adapted to facilitate storage of the data processing devices (102) in a high-density computing environment. The high-density computing environment may be, for example, a data center or another type of location where multiple data processing devices are located. To facilitate storage of the data processing devices (102), the frame (100) may include any number of structural members (e.g., beams, brackets, bars, etc.) and any number of mechanical mounting points (e.g., holes, threaded portions, etc.) disposed on the structural members to facilitate storage of the data processing devices (102).

Different structural members may have different shapes, sizes, and/or other physical characteristics. The shapes, sizes, and/or other physical characteristics of the structural members may be adapted to enable the structural members to be mechanically connected (e.g., permanently or reversibly connected) to each other to form a predetermined structure. The predetermined structure may be, for example, a cage, box, or other type of structure that facilitates positioning and/or orienting the data processing devices (102).

When all, or a portion, of the structural members are mechanically connected to each other, the mechanical mounting points may be disposed at predetermined locations. The predetermined locations may correspond to similar predetermination locations on the data processing devices (102) where mechanical mounting elements, complementary to the mechanical mounting point, are disposed. By doing so, the frame (100) and the data processing devices (102) may be adapted to position the data processing devices (102) in locations and/or orientations compatible with a high-density computing environment, or another environment in which the data processing devices (102) may be located.

The mechanical mounting points may be any type of physical structure for attaching (permanently or reversibly) the data processing devices (102) to the frame (100). There may be any number of mechanical mounting points to facilitate the attachment of any number of data processing devices.

The frame (100) may be implemented using any number of suitable materials. For example, portions of the frame (100) may be implemented using metals (e.g., steel, aluminum, etc.). In another example, portions of the frame (100) may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the frame (100) may be implemented using rubber (e.g., latex, styrene-butadiene rubbers, etc.) The frame (100) may be implemented using any quantity and combination of suitable materials without departing from the invention.

In one or more embodiments of the invention, the data processing devices (102) are physical structures. For example, the data processing devices (102) may include a chassis and one or more computing devices disposed within the chassis. For additional details regarding computing devices, refer to FIG. 5.

A chassis may be a mechanical device that is adapted to (i) facilitate attachment of the data processing device to the frame, (ii) house the one or more computing devices, (iii) house one or more electromagnetic interference emitting devices, and/or (iv) provide thermal management services to the computing devices and/or the electromagnetic interference emitting devices. For example, a chassis may be a frame mountable structure (e.g., a rectangular box) that includes internal space that may be used to house computing devices and/or electromagnetic interference emitting devices. Thus, the chassis may be a frame mountable chassis.

The chassis may be implemented using any number of suitable materials. For example, portions of the chassis may be implemented using metals (e.g., steel, aluminum, etc.). In another example, portions of the chassis may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the chassis may be implemented using rubber (e.g., latex, styrene-butadiene rubbers, etc.) The chassis may be implemented using any quantity and combination of suitable materials without departing from the invention.

To facilitate attachment of the data processing device to the frame, the chassis may include any number of mechanical mounting elements. The mechanical mounting elements may be located at predetermined locations. The predetermined locations may correspond to similar predetermination locations on the frame (100) where mechanical mounting points, complementary to the mechanical mounting elements, are disposed.

For example, a mechanical mounting element may be a rail disposed on a side of a chassis of a data processing device. The location of the rail may correspond to a position on the frame (100) where a rail guide (i.e., a complementary mechanical mounting point) is disposed. The rail and the rail guide may facilitate attachment of a data processing device to the frame (100) which, in turn, positions and orients the data processing device relative to the frame (100).

To house the one or more computing devices, the chassis may include one or more internal volumes. The internal volumes may facilitate disposing of the one or more computing devices (and/or other devices such as electromagnetic interference emitting devices) within a data processing device.

To house the one or more electromagnetic interference emitting devices, the chassis may include one or more internal volumes (e.g., separate and/or the same as the internal volumes for housing computing devices). The internal volumes may have a shape or other characteristic(s) that facilitates disposing of the one or more electromagnetic interference emitting devices within the data processing device. For example, an internal volume of the chassis may be a rectangular void capable of housing one or more electromagnetic interference emitting devices. The internal volume may have other shapes without departing from the invention.

In one or more embodiments of the invention, the one or more internal volumes of the data processing devices are adapted to restrict propagation of electromagnetic interference emitted by the electromagnetic interference emitting devices (and/or other devices such as computing devices). For example, one or more portions of the chassis that bound the one or more internal volumes may be made of metal of a predetermined thickness to prevent and/or limit transmission of electromagnetic interference through the one or more portions of the chassis. By doing so, the electromagnetic interference generated by the electromagnetic interference emitting devices may be prevented (or at least severely attenuated when leaving an internal volume) from propagating from within the data processing devices (102) into the ambient environment surrounding the respective data processing devices (102) (and/or restricted from propagating to other portions of the data processing devices).

In another example, one or more portions of the chassis that bound the one or more internal regions may be formed in a manner that filters (e.g., reflects/attenuates radiation of a certain frequency while allowing radiation of other frequencies to propagate) electromagnetic radiation when electromagnetic radiation passes through the portions of the chassis. For example, a portion of the chassis that bounds the one or more internal regions may be a waveguide filter such as an array of holes (e.g., sub-wavelength apertures corresponding to a particular frequency) in a metal sheet. By doing so, the electromagnetic interference generated by the electromagnetic interference emitting devices may be severely attenuated (e.g., attenuated by greater than 90 decibels) when propagating from within the data processing devices (102) into the ambient environment surrounding the respective data processing devices (102) (and/or restricted from propagating to other portions of the data processing devices).

In a further example, one or more portions of the chassis that bound the one or more internal regions may be made of an electromagnetic radiation attenuating material of a predetermined thickness to prevent and/or limit transmission of electromagnetic interference through the one or more portions of the chassis. The electromagnetic radiation attenuating material may be, for example, a composite of plastic or rubber that includes particulates of iron, carbonyl iron, or other electromagnetically lossy material. By doing so, the electromagnetic interference generated by the electromagnetic interference emitting devices may be severely attenuated (e.g., attenuated by greater than 90 decibels) when propagating from within the data processing devices (102) into the ambient environment surrounding the respective data processing devices (102) (and/or restricted from propagating to other portions of the data processing devices).

To provide thermal management services to the computing devices and/or the electromagnetic interference emitting devices and/or other types of devices, the data processing devices (102) may facilitate the flow of gas proximate to the computing devices and/or electromagnetic interference emitting devices. By doing so, the thermal state (i.e., temperature) of the aforementioned devices may be regulated. The gas may be air or another type/combination of gasses obtained from any source.

For example, a data processing device may include one or more vents that enable gas from a first side of a data processing device to flow into the data processing device, through the data processing device, and out of a second side of the data processing device. The gas, flowing through the data processing device, may be at a different temperature than the computing devices and/or electromagnetic interference emitting devices. Consequently, thermal exchange between the flow of gas and the aforementioned devices may occur resulting in the temperature of the aforementioned devices changing. By doing so, heat generated by the aforementioned devices may be expelled from the devices thereby regulating the temperature of the aforementioned devices.

A system in accordance with embodiments of the invention may include any number of data processing devices. Different data processing devices (102) may have different configurations and/or uses within the system.

For example, some data processing devices may be adapted to house many electromagnetic interference emitting devices while other data processing devices may be primarily adapted to house computing devices. Additional data processing devices may be adapted to exclusively house data processing devices and no electromagnetic interference emitting devices. A system in accordance with embodiments of the invention may include any number and combination of data processing devices adapted for any number of different uses without departing from the invention.

By way of example, the system of FIG. 1.1 may include a first data processing device (104). The first data processing device (104) may be of a larger size than a second data processing device (106) and, consequently, may be capable of housing a larger number of electromagnetic interference emitting devices and/or other types of devices. The system of FIG. 1.1 may further include a third data processing device (108). In contrast to the first data processing device (104) and the second data processing device (106), the internal structure of the third data processing device (108) may be adapted to only housing computing devices rather than electromagnetic interference generating devices.

For additional details regarding data processing devices, refer to FIGS. 2.1-2.7.

As discussed above, data processing devices (102) may house electromagnetic interference emitting devices. When so housed, the electromagnetic interference emitting devices may operate thereby generating electromagnetic interference (e.g., electromagnetic radiation). At different points in time, it may be useful to add or remove electromagnetic interference emitting devices to or from the data processing devices (102). To facilitate such additions and/or removals, different portions of the data processing devices (102) may be adapted to reversibly provide access to the internal volumes of the data processing devices.

For example, the different portions of the data processing devices (102) may be adapted to rotate, translate, or otherwise move with respect to the remaining portions of the data processing devices (102). When the different portions of the data processing devices (102) are in a first predetermination position and/or orientation, they may electromagnetically seal one or more internal volumes of the data processing devices (102). That is, they may limit the extent to which electromagnetic radiation within the internal volumes is able to propagate to an ambient environment. However, when the different portions of the data processing devices (102) are rotated, translated, and/or otherwise moved to a second predetermined position and/or orientation to enable access to the internal volumes, the data processing devices (102) may not be electromagnetically sealed. Consequently, electromagnetic radiation within the internal volumes may be less limited by the data processing devices (102) to propagate into the ambient environment when access to the internal volumes is provided.

The data processing devices (102) may include hinges, slides, knobs, and/or other mechanical devices that facilitate movement of the different portions of the data processing devices (102) to reversibly reconfigure the data processing devices (102) between states where access (i.e., physical accessibility) to the internal volumes of the data processing devices (102) is provided and states where access to the internal volumes of the data processing devices (102) is not provided. FIGS. 1.2-1.3 show diagrams of the data processing devices (102) facilitating the addition, modification, and/or removal of electromagnetic interference emitting devices from the internal volumes of the data processing devices (102).

While the system of FIG. 1.1 has been illustrated as including a limited number of components, a system in accordance with embodiments of the invention may include any number of frames, data processing devices, and/or other components without departing from the invention. For example, any number of frames (and/or other types of physical devices for positioning/orienting devices) may be used in a high density computing environment to facilitate the placement and/or orientation of any number of data processing devices. Further, the frames may be used to position and/or orient other types of devices. The other types of devices may be, for examples, servers, storage nodes, compute nodes, communication devices (e.g., switches, routers, etc. for facilitating communications between any number of devices and/or devices external to a high density computing environment), or any other type of device that may be used in a computing environment (e.g., data center, computing nodes, communications center, etc.). Thus, the frame and data processing devices may be used in conjunction with any number and/or type of other device without departing from the invention.

FIG. 1.2 shows a diagram of the example system of FIG. 1.1 in a configuration (i.e., after a reconfiguration from the configuration illustrated in FIG. 1.1) where a front vent (110) of the first data processing device (104) has been opened. The front vent (110) may be opened by physically rotating and/or translating the front vent (110) to move the front vent (110) to a new physical location. By opening the front vent (110), physical access to internal volumes of the first data processing device (104) may be provided. Consequently, the internal configuration of the internal volumes of the first data processing device (104) may be modified. For example, electromagnetic interference emitting devices may be removed from and/or added to the internal volumes. Similarly, computing devices may be added to and/or removed from the internal volumes.

However, in the state illustrated in FIG. 1.2, the ability of the first data processing device (104) to limit propagation of and/or attenuate electromagnetic interference generated by electromagnetic interference emitting devices disposed within the first data processing device (104) may be compromised. In other words, the first data processing device (104) may be in an electromagnetic interference suppression compromised state that allows electromagnetic interference within internal volumes of the first data processing device (104) to propagate to the ambient environment around the first data processing device (104) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the first data processing device (104) automatically causes all, or a portion, of the electromagnetic interference emitting devices disposed within its internal volumes to suspend generation of electromagnetic interference when in the electromagnetic interference suppression compromised state illustrated in FIG. 1.2. By doing so, the first data processing device (104) may provide electromagnetic interference management services when the first data processing device (104) is in an electromagnetic interference suppression compromised state. All, or a portion, of the data processing devices of a system in accordance with embodiments of the invention may provide similar electromagnetic interference management services.

Similar to FIG. 1.2, FIG. 1.3 shows a diagram of the example system of FIG. 1.1 in a second configuration (i.e., after a reconfiguration from the configuration illustrated in FIG. 1.1) where a top door (112) of the second data processing device (106) has been opened after translating the second data processing device (106) with respect to the frame. The top door (112) may be all, or a portion, of the chassis that may be reversibly moved to enable access to internal volumes of the first data processing device (104).

The top door (112) of, for example, the second data processing device (106) may be mounted to the frame (100) via rails that enable the second data processing device (106) to translate with respect to the frame (100) via application of physical force. Once translated to a predetermined location, the top door (112) may be opened by application of physical force by a user.

By opening the top door (112), physical access to the internal volumes of the second data processing device (106) may be provided. Consequently, the internal configuration of the internal volumes of the second data processing device (106) may be modified. For example, electromagnetic interference emitting devices may be removed from and/or added to the internal volumes of the second data processing device (106). Similarly, computing devices may be added to and/or removed from the internal volumes of the second data processing device (106).

However, in the state illustrated in FIG. 1.3, the ability of the second data processing device (106) to limit propagation of and/or attenuate electromagnetic interference generated by electromagnetic interference emitting devices disposed within the second data processing device (106) may be compromised. In other words, the second data processing device (106) may be in an electromagnetic interference suppression compromised state that allows electromagnetic interference within internal volumes of the second data processing device (106) to propagate to the ambient environment around the second data processing device (106) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the second data processing device (106) automatically causes all, or a portion, of the electromagnetic interference emitting devices disposed within its internal volumes to suspend generation of electromagnetic interference when in the electromagnetic interference suppression compromised state illustrated in FIG. 1.3. By doing so, the second data processing device (106) may provide electromagnetic interference management services when the second data processing device (106) is in an electromagnetic interference suppression compromised state. All, or a portion, of the data processing devices of a system in accordance with embodiments of the invention may provide similar electromagnetic interference management services (e.g., automatically terminating and/or resuming the electromagnetic interference generation depending on the electromagnetic interference suppression state of the data processing device).

Thus, as illustrated in FIGS. 1.1-1.3, a system in accordance with embodiments of the invention may provide electromagnetic interference management services to devices disposed with the data processing devices when the data processing devices are in an electromagnetic interference suppression compromised state or an electromagnetic interference suppressed state.

As discussed above, a system in accordance with one or more embodiments of the invention may include one or more data processing devices. FIGS. 2.1-2.7 show diagrams of data processing devices in accordance with embodiments of the invention.

FIG. 2.1 shows a diagram of the second data processing device (106) in accordance with one or more embodiments of the invention. As discussed above, the second data processing device (106) may provide electromagnetic interference management services for electromagnetic interference emitting devices disposed within the second data processing device (106). In addition to electromagnetic interference management services, the second data processing device (106) may provide power management services and communications services. The aforementioned services may be provided to electromagnetic interference emitting devices and/or computing devices and/or other types of devices disposed within the second data processing device (106).

To do so, the second data processing device (106) may include a chassis (198). The chassis (198) may be a structure that is mountable to a frame. By being mountable to a frame, the chassis (198) may be usable in a high density environment. For example, the chassis (198) may be a rail mount chassis. The chassis (198) may be mountable via other methods (e.g., using mechanical features other than rails such as bolts, screws, pins, etc.).

The chassis (198) may include a front vent (200), a rear vent (204), a support module (208), and a payload module (210). Each of these components of the second data processing device (106) is discussed below.

The front vent (200) may be a physical device for (i) enabling gas flow through the second data processing device (106) and (ii) limiting the propagation of electromagnetic interference from an internal volume of the second data processing device (106) and/or attenuating electromagnetic interference that propagates from an internal volume of the second data processing device (106) to an ambient environment around the second data processing device (106) via the front vent (200).

In one or more embodiments of the invention, the front vent (200) reflects and/or attenuates electromagnetic radiation that is propagating from the internal volume (214) to an ambient environment through the front vent (200) by at least 90 decibels (or another suitable level such as, for example, 30 decibels, 45 decibels, 60 decibels, 75 decibels, etc.). By doing so, the front vent (200) may delineate one of the walls of the internal volume (214) to enable the internal volume (214) to be electromagnetically suppressed and/or isolated by 90 decibels (or another suitable level of suppression/isolation) from the ambient environment and/or other portions of the chassis (e.g., the support module (208)).

In one or more embodiments of the invention, the front vent (200) is a rectangular structure formed with holes (202) that enable gasses to flow between the ambient environment surrounding the second data processing device (106) and an internal volume of the second data processing device (106). By doing so, the second data processing device (106) may provide thermal management services to components disposed within the second data processing device (106) by controlling the flow of gasses from the ambient environment through the second data processing device (106).

For example, the second data processing device (106) may be used in a high-density computing environment in which a source of cool gas is supplied to a first side of the second data processing device (106). In such an environment, the second data processing device (106) may cause the cool gas to flow into the second data processing device (106) via the front vent (200) and exhaust gas out a second side of the second data processing device (106) (e.g., out of the support module (208)). Alternatively, the second data processing device (106) may cause a reverse gas flow, with respect to the gas flow discussed above, if the source of cool gas is supplied proximate to the support module (208) rather than proximate to the front vent (200).

The structure of the front vent (200) may also be adapted to limit propagation of electromagnetic radiation through the front vent (200) and/or attenuate electromagnetic radiation that propagates through the front vent (200). For example, the size, position, number, shape, and/or other characteristics of the holes (202) through the front vent may be adapted to (i) limit propagation of electromagnetic radiation and/or (ii) attenuate propagating electromagnetic radiation. In another example, the thickness and material choice of the front vent (200) may be adapted to (i) limit propagation of electromagnetic radiation and/or (ii) attenuate propagating electromagnetic radiation. By being so adapted, the front vent (200) may attenuate electromagnetic radiation that propagates through the front vent (200) by at least 90 decibels or another desirable quantity (e.g., 30 decibels, 45 decibels, 60 decibels, 75 decibels, 120 decibels, etc.).

To facilitate the flow of gas between the ambient environment and the internal volume of the second data processing device (106), the size, position, number, shape, and/or other characteristics of the holes (202) may be selected to meet gas flow requirements for thermal management purposes while providing electromagnetic interference suppression characteristics.

In one or more embodiments of the invention, the rear vent (204) is similar to the front vent (200). For example, the rear vent (204) may provide similar attenuation and/or restriction of propagation of electromagnetic radiation while enabling gasses to flow between internal volumes of the second data processing device. The rear vent (204) may have a similar structure to that of the front vent (200). However, the structure (e.g., different hole pattern, thickness, hole type, etc.) and/or electromagnetic (e.g., attenuation and/or reflection of electromagnetic radiation) and/or hydrodynamic (e.g., impedance to fluid flow) characteristics of the rear vent (204) may be different from the front vent (200) without departing from the invention.

The front vent (200) and/or the rear vent (204) may be further adapted to facilitate obtaining of optical information from devices disposed within the payload module (210). The optical information may be used to determine an optical state of the respective devices disposed within the payload module (210) (and/or other locations within the second data processing device).

In one or more embodiments of the invention, the front vent (200) and/or the rear vent (204) is adapted to facilitate obtaining of optical information by including a feature that enables a portion of an optical state detector (discussed in greater detail with respect to FIG. 2.4) to extend through the respective vent while the respective vent is still able to attenuate propagating electromagnetic radiation. The feature may, for example, be a hole having a diameter that prevents electromagnetic radiation radiated by the devices from propagating through the hole while the portion of the optical state detector is extended through the vent. The diameter may, for example, render the hole to be a sub-wavelength aperture with respect to the electromagnetic radiation radiated by the devices. Consequently, the hole may not support propagating modes (e.g., may only support evanescent modes) for the electromagnetic radiation that is radiated by the devices. The feature may be other types of structures (e.g., different structures that facilitate inserting a portion of an optical state detector into the internal volume while the internal volume suppresses electromagnetic interference) without departing from the invention.

While the optical state detector has been described as extending through a vent, as will be discussed in greater detail below, the optical state detector may extend through different structures of data processing devices that delineate boundaries of internal volumes that suppress electromagnetic interference without departing from the invention.

The payload module (210) may be a physical device for (i) housing electromagnetic interference devices, (ii) limiting propagation of electromagnetic interference from internal volumes of the second data processing device (106) to the ambient environment surrounding the second data processing device (106), and (iii) thermally regulating devices disposed within the payload module (210). For additional details regarding the payload module (210), refer to FIG. 2.2.

The support module (208) may be a physical device for housing devices that provide services to devices disposed within the payload module (210). For example, the support module (208) may house one or more power supplies (e.g., a power system), fans (e.g., a thermal management system), networking devices (e.g., a communication system), and/or computing devices. The aforementioned devices may provide corresponding services to devices disposed in other portions of the second data processing device (106) and/or devices located in other locations (i.e., external to the second data processing device (106).

In one or more embodiments of the invention, the support module (208) does not provide electromagnetic interference management services to devices disposed within the support module (208), in contrast to the payload module (210). For example, the support module (208) may not intentionally isolate electromagnetic interference generated by devices disposed within the support module (208) from the ambient environment surrounding the second data processing device (106). Intentionally isolating electromagnetic interference means that the structure of a physical structure is adapted to provide such isolation. While many types of physical structures may provide some degree of electromagnetic interference isolation as an inherent consequence of their existence, the electromagnetic interference isolation is not intended. Rather, the physical structures may exist for their other properties such as mechanical strength while providing some degree (albeit low) of electromagnetic interference isolation. Thus, while the support module (208) may to some degree electromagnetically separate devices disposed within the support module (208) from the ambient environment, the support module (208) does not provide electromagnetic interference management services. Providing electromagnetic interference management services may refer to providing at least 20 decibels of attenuation or another suitable level of attenuation (e.g., at least 35 decibels).

In one or more embodiments of the invention, providing electromagnetic interference management services reduces the strength of electromagnetic radiation by at least 20 decibels when the electromagnetic radiation propagates from an internal volume of a data processing device to an ambient environment outside of the data processing device.

The one or more power supplies may supply power to other devices. For example, the power supplies may provide power to electromagnetic interference emitting devices disposed within the payload module (210), other types of devices (e.g., computing device) disposed within the payload module, and/or devices located in other areas.

The one or more power fans may provide thermal management services to other devices. For example, the fans may regulate the flow of gasses through the second data processing device and, consequently, manage the thermal state of electromagnetic interference emitting devices and/or other types of devices disposed in the payload module (210) and/or the support module (208).

The one or more power networking devices may provide communication services to other devices (e.g., providing network services). For example, the networking devices may manage network interfaces that enables the second data processing device (106) to communicate with other devices (e.g., computing devices that may be controlling the operation of the electromagnetic interference emitting devices).

The one or more computing devices may manage the operations of the other entities of the second data processing device (106). For example, the computing devices may send messages to the electromagnetic interference emitting devices to perform predetermined functionality. Such messages, when received by the electromagnetic interference emitting devices may cause the electromagnetic interference emitting devices to stop and/or start emitting electromagnetic interference (and/or perform other actions).

The computing devices may send such instructions when (or around the time when) the electromagnetic interference suppression state of the second data processing device (106) is changed (i.e., when portions of the second data processing device (106) are physically reconfigured). The computing devices may make such determinations based on any number of sensors (not shown) that monitor the physical configuration of the second data processing device (106). The sensors may be disposed, for example, in the payload module, on the vents, or at other locations such that measurements by the sensors indicate the thermal state of components of the second data processing device for which thermal management services (e.g., monitoring the thermal state of components and taking actions such as modifying the rate of gas flow to manage the thermal state of the components) are being provided.

In another example, the computing devices may send messages to fan controllers (not shown) or other devices that manage the operation of gas flow control devices disposed within the second data processing device (106). The computing devices may send such messages based on the thermal state (i.e., temperature) of one or more devices disposed within the second data processing device (106). The computing devices may monitor such thermal states using any number of sensors (not shown) and/or based on messages received from the one or more devices disposed within the second data processing device (106).

In response to receipt of such messages, the fan controllers or other devices may modify the operational state of the gas flow control devices. By doing so, the computing devices may change the thermal state of devices disposed within the second data processing device (106) by controlling the flow of gasses through the second data processing device (106).

To manage the operation of the other entities of the second data processing device (106), one or more processors of the computing devices may execute instructions (e.g., computer code), stored on a persistent storage, that cause the computing devices to perform all, or a portion, of the method illustrated in FIG. 3. For additional details regarding computing devices, refer to FIG. 5.

To further clarify aspects of embodiments of the invention, a cross section diagram of the second data processing device (106) in accordance with one or more embodiments of the invention is shown in FIG. 2.2. In FIG. 2.2, the cross section is taken along the X-Y plane illustrated in FIG. 2.1.

As seen from FIG. 2.2, the payload module (210) may include an internal volume (214). The internal volume (214) may be used to house devices such as electromagnetic interference emitting devices, supports for such devices, and/or other devices that may provide services to the electromagnetic interference emitting devices and/or other devices.

The internal volume (214) may be bounded, on four sides, by portions of the payload module (210). For example, the internal volume (214) may be bounded by a top door (212), a bottom (218), a first side (216), and a second side (not shown). These four components of the payload module (210) may define a rectangular shape of the internal volume (214) (e.g., may define four boundaries of the internal volume).

The internal volume (214) may be further bounded, on a fifth and sixth size, by the front vent (200) and the rear vent (204). The front vent (200) and the rear vent (204) may be on opposite sides of the internal volume (214). By doing so, the front vent (200) and the rear vent (204) may define a gas flow path through the payload module (210). For example, gasses may be able to flow from between the two vents through the internal volume (214).

As discussed above, the second data processing device may control gas flows disposed within the second data processing device to provide thermal management services. To do so, the second data processing device may include a thermal management system (220). The thermal management system (220) may include (i) flow control devices, (ii) temperature sensors, and/or (iii) a controller.

The controller may operate the flow control devices based on temperature information obtained from the temperature sensors and/or temperature information obtained from other devices (e.g., from electromagnetic interference emitting devices). For example, the controller may increase the flow rate of a gas flow disposed within the second data processing devices to manage the temperature of one or more devices within a predetermined range.

The flow control devices may be, for example, fans or other types of active devices for controlling the flow of gasses. The thermal management system (220) may include any number of flow control devices without departing from the invention.

The second data processing device may also include a power system (222). The power system may provide power to any number and/or types of devices disposed within the second data processing device. For example, the power system (222) may provide power to electromagnetic interference emitting devices disposed within the payload module (210), the thermal management system (220), a communication system (224), and/or computing devices (226).

To do so, the power system (222) may include, for example, one or more power supplies, regulators, controllers, and/or other types of components for providing power. The aforementioned components may identify components to which power is to be supplied, identify a quantity of power to supply to each of the components, and/or provide the power to each of the respective components. As will be discussed in greater detail below, the power system (222) may provide power using an interconnect (230).

The second data processing device may further include a communication system (224). The communication system (224) may provide communication services. As discussed above, due to the electromagnetic interference isolation provided by the second data processing device, components disposed within the internal volume (214) may be unable to communicate with other devices via wireless communications due to the electromagnetic isolation provided by the internal volume (214). To facilitate communications between the devices disposed in the internal volume (214) and other devices, the communication system (224) may provide communication services to the devices using wired connections.

To provide communication services, the communication system (224) may include, for example, one or more transceivers, communication processors, and/or other types of components for providing communication services. The aforementioned components may provide the communication services. The communication services may include, for example, exchanging network data units with electromagnetic interference emitting devices (and/or other types of devices) disposed in the payload module, a computing device (226) disposed in the support module (208), and/or other devices disposed outside of the second data processing device. By doing so, the aforementioned devices may communicate with one another via information included in the exchanged network data units. A network data unit may be a communication supported by a communication protocol that enables information to be transmitted. A network data unit may be, for example, a packet in the event that an internet protocol is utilized. Other types of communications protocols may be utilized without departing from the invention. As will be discussed in greater detail below, the communication system (224) may provide the communication services using an interconnect (230) (e.g., a wired path for communications purposes and/or other electrical purposes).

The computing device (226) may manage the operation of the components of the second data processing device. For example, the computing device (226) may manage the thermal management system (220), the power system (222), the communication system (224), and/or other components (such as electromagnetic interference emitting devices) disposed within the second data processing device. To manage the other devices, the computing device (226) may use the communication services provided by the communication system (224) as well as the interconnect (230).

The interconnect (230) may be a physical device for providing operable connections between devices disposed within the second data processing device. The interconnect (230) may support distribution of power by the power system (222) to any number of devices disposed within the payload module (210), the support module (208), and/or other locations.

For example, the interconnect (230) may include a set of wires that physically interconnect devices disposed within the second data processing device.

In one or more embodiments of the invention, the interconnect (230) facilitates distribution of power to electromagnetic interference emitting devices disposed within the payload module (210) while the electromagnetic interference emitting devices are isolated. By doing so, the electromagnetic interference emitting devices may be provided power without negatively impacting the operation of other devices due to electromagnetic interference generated by the electromagnetic interference emitting devices.

To do so, the second data processing device may include a back-plane (232). The back-plane may electromagnetically isolate the interconnect (230) from the internal volume of the payload module (210). For example, the back-plane (232) may be a metal sheet of sufficient thickness to prevent electromagnetic interference from penetrating through the back-plane (232).

The back-plane (232) may include any number of feedthroughs (234). The feedthroughs (234) may be physical devices that enable the interconnect (230) to physically connect to any number of devices disposed within the payload module (210).

While devices disposed in the internal volume may be controlled remotely (e.g., controlled by the computing device (226) or other types of devices), such control may be made by sending and receiving data to and from the devices. However, other types of information (other than that provided by the devices) may be collected from the devices disposed in the internal volume (214). For example, optical state information (as discussed above) may be obtain from the devices. Such information may be used to determine an operational state (or other information) regarding the devices that may not be present in the information provided by the devices using the interconnect.

For example, consider a scenario where a device disposed in the internal volume receives a request to perform an action. Performing the action may (i) change an operational state of the device and (ii) change an optical state of the device. After performing the action, a request for the operation state of the device may be obtained. However, due to an error state of the device, the device may indicate (in response to the request) that the device is in a second operation state that does not accurately reflect the actual operational state of the device. To improve the accuracy of determining the state of devices disposed in the internal volume (214), embodiments of the invention may provide a method for collecting optical information from devices disposed in the internal volume (214). The optical information may be used to determine an optical state of the respective devices. The optical state of the respective devices may be used to more accurately determine an actual operational state of the respective devices (and/or determine other information regarding the respective devices).

To further clarify the operation of the second data processing device, FIG. 2.3 shows a second cross section diagram, similar to that of FIG. 2.2, but including electromagnetic interference emitting devices (250). In the state illustrated in FIG. 2.3, the second data processing device may provide electromagnetic interference suppression services, communication services, power services, and/or management services to one or more of the electromagnetic interference emitting devices (250).

To provide electromagnetic interference suppression services, the second data processing device may limit propagation of electromagnetic radiation emitted by the electromagnetic interference emitting devices (250) to within the payload module (210). By doing so, electromagnetic interference emitting devices (250) may perform the functionality while in high density computing environment without negatively impacting their operation of other devices disposed in the high density computing environment due to the emitted electromagnetic radiation.

To provide the communication services, power services, and/or management services, electromagnetic interference emitting devices (250) may be operably connected to the power system (222), the communication system (224), and/or the computing device (226), via the interconnect (230). By doing so, the operation of the electromagnetic interference emitting devices (250) may be managed by the computing device (226) and/or other devices operably connected to the electromagnetic interference emitting devices (250) via the communication system (224).

As discussed above, when the electromagnetic interference emitting devices (250) are operating, the optical states of the electromagnetic interference emitting devices (250) may change over time. For example, any of the electromagnetic interference emitting devices (250) may include a display that generates optical patterns corresponding to the operation of the respective device. As the operation of the respective devices changes, the optical patterns generated by the displays may change to reflect to changed operation of the respective devices.

To obtain information regarding the optical state of the devices disposed in a data processing, a system in accordance with one or more embodiments of the invention may include one or more optical state detectors. FIG. 2.4 shows a side view diagram of an optical state detector (260) in accordance with one or more embodiments of the invention. The optical state detector may be used obtain an optical state of one or more devices disposed in a data processing device.

In one or more embodiments of the invention, optical state detector (260) is a physical device adapted to obtain optical states of one or more devices disposed in the data processing device. To do so, the optical state detector (260) may include a controller (262) an optical collector (263). Each component of the optical state detector (260) is discussed below.

In one or more embodiments of the invention, the controller (262) is a physical device adapted to determine an optical state of the device based on an optical pattern obtained using an optical collector (263). For example, the controller (262) may obtain an optical pattern using the optical collector. The optical pattern may be based on optical electromagnetic radiation (e.g., light) corresponding to a device.

In one or more embodiments of the invention, the optical state of the device is a representation of a pattern of light emitted by the device. The pattern of light emitted by the device may be emitted by a display of the device. The optical state of the device may be, for example, an image of a display of the device. The optical state of the device may be an image of a different portion of the device without departing from the invention. For example, in some embodiments of the invention that optical state may be an image of any portion of the device that may emit light (or otherwise change its optical appearance) to convey information.

In one or more embodiments of the invention, the controller (262) includes an image sensor (262.4) to convert the optical pattern obtained using the optical collector (263) to an optical state of the device. For example, the image sensor (262.4) may be a charge coupled device. The image sensor (262.4) may be operatively connected to the optical collector (263) to enable the image sensor (262.4) to obtain the optical pattern using optical collector (263).

In one or more embodiments of the invention, the controller (262) includes a computing device (262.2) that orchestrates the operation of optical state detector (260). The computing device (262.2) may obtain one or more optical states of devices and provide the optical state of the devices to other entities. The other entities may control the operation of the devices. The other entities may utilize such optical state information provided by the controller (262) to control the operation of the devices. For example, the other entities may make determinations regarding the operational states of the devices using the optical state information and take action (e.g., send requests to the devices to perform predetermined functionality) based on the determined operational states of the devices.

The computing device (262.2) may be, for example, a mobile phone, tablet computer, laptop computer, desktop computer, server, embedded computer, or cloud resource. The computing device (262.2) may include one or more processors, memory random access memory), and persistent storage (e.g., disk drives, solid state drives, etc.). The persistent storage may store computer instructions (in addition to other data), e.g., computer code, that (when executed by the processor(s) of the computing device) cause the computing device (262.2) to perform the functions of the controller (262) described in this application and/or all, or a portion, of the method illustrated in FIG. 3. The computing device (262.2) may be other types of computing devices without departing from the invention. For additional details regarding computing devices, refer to FIG. 5.

In one or more embodiments of the invention, the functionality of the computing device (262.2) is performed by another device separate from the controller (262). For example, the functionality of the computing device (262.2) may be performed by a computing device (e.g., 226, FIG. 2.2) disposed in the data processing device or a remote device.

The optical collector (263) may be a physical device for obtaining optical patterns corresponding to devices. The optical collector (263) may be adapted to be disposed through a boundary of an internal volume of a data processing device that suppresses electromagnetic interference without enabling electromagnetic interference to propagate out of the internal volume without being attenuated by a predetermined amount (e.g., 90 decibels, 35 decibels, etc.). The optical collector (263) may further be adapted to obtain optical patterns from devices and provide the optical patterns to the controller (262).

In one or more embodiments of the invention, the optical collector (263) does not include any conductive material. In one or more embodiments of the invention, the optical collector (263) does not include any semi-conductive material. In one or more embodiments of the invention, the optical collector (263) comprises electrically insulating materials.

To provide the above noted functionality of the optical collector (263), the optical collector may include an extension (264), a director (266), and an optical pickup (268). Each of these components of the optical collector (263) is discussed below.

In one or more embodiments of the invention, the extension (264) is a physical structure adapted to (i) traverse a boundary of an internal volume without facilitating propagation of electromagnetic radiation through the boundary and (ii) provide optical patterns obtained from the optical pickup (268) to the controller (262). The extension (264) may include one or more optical fibers. The one or more optical fibers may be operably coupled to the optical pickup (268) on a first end and may be operably coupled to the controller (262) on the other end. The one or more optical fibers may enable optical patterns to be transmitted along the length of the extension (264).

The extension (264) may further including sheathing (not shown) and/or structural members (not shown) for maintaining a shape of the extension (264). For example, the extension (264) may have a rod-like shape that enables the optical pickup (268) to be disposed away from the controller (262) while being physically supported by the extension.

The director (266) may be a portion of the extension (264) that facilitates orienting and/or positioning of the optical pickup (268) with respect to an axis (265) of the extension (264). For example, the director (266) may be a portion of the extension (264) that may be rotated away from an axis (265) of the extension (264). Consequently, the optical pickup (268) may be positioned and/or oriented away from the axis (265) of the extension (264).

The optical pickup (268) may be a physical device for obtaining an optical pattern. For example, the optical pickup (268) may include one or more lenses that enable light emitted by the device to be captured and/or focused onto the extension (264) in a manner that enables the optical pattern to be transmitted along the length of the extension (264).

While the optical state detector (260) has been described and illustrated in FIG. 2.4 as including a limited number of specific components, an optical state detector in accordance with one or more embodiments of the invention may include additional, fewer, and/or different components than those illustrated in FIG. 2.4 without departing from the invention.

As discussed above, the optical state detector (260) may be used in conjunction with and/or may be a part of a data processing device. To further clarify potential uses of the optical state detector (260), FIG. 2.5 shows a third cross section diagram of the second data processing device in accordance with one or more embodiments of the invention. The cross-section diagram of FIG. 2.5 may be similar to that of FIG. 2.3, but includes the optical state detector (260).

As seen from FIG. 2.5, a first portion (e.g., the controller (262) and/or a portion of the extension (264)) of the optical state detector (260) may be disposed outside of an internal volume of the second data processing device. The extension (264) may be disposed across a boundary of the internal volume. In this example, the extension (264) is disposed through a hole of the front vent (200). By doing so, the extension (264) may facilitate transmission of optical patterns obtained by the optical pickup (268), disposed inside of the internal volume, through a boundary of the internal volume and to the controller (262).

The optical pickup (268) may be disposed proximate to one of the devices disposed inside of the internal volume. By doing so, the optical pickup (268) may obtain optical radiation (270) from the device to obtain an optical pattern by focusing optical radiation (270). The obtained optical pattern may be transmitted to the controller (262) through the extension (264). For example, as described above, the extension (264) may include one or more optical fibers. The optical fibers may be, for example, optical tubes that facilitate transmission of optical radiation along the length of the optical fibers. Thus, the optical pattern obtained by the optical pickup (268) may be provided to a first end of an optical fiber, transmitted along the length of optical fiber, and provided to the controller (262) that is coupled to a second end of the optical fiber.

Once controller (262) obtains the optical pattern, an optical state of the device may be determined based on the optical pattern. For example, the controller (262) may focus the optical pattern on an image sensor to obtain a digital representation of the optical state of the device. In other words, an image of a portion (e.g., a screen/display/light/other optical indicator) of the device.

The controller (262) may provide the optical state of the device to any number of other devices. While not illustrated in FIG. 2.5, the controller (262) may be operably connected to any number of other devices via any combination of wired and/or wireless connections. The controller (262) may provide the optical state of the device to the other devices via the operable connections between the controller (262) and other devices. For example, the controller (262) may send image files or other data structures representative of the optical state of the device to the other devices.

In one or more embodiments of the invention, the controller (262) is adapted to determine the optical states of devices in response to requests for the optical states from other devices. For example, the controller (262) may receive a request for an optical state of device from a computing device that is controlling the operation of the device. In response to receiving the request, the controller (262) may obtain optical state of the device, as discussed above, and provide the optical state of the device to the computing device via an operable connection to the computing device.

While the optical state detector (260) is illustrated in FIG. 2.5 as including a single optical collector to obtain an optical state of a corresponding device, an optical state detector in accordance with one or more embodiments of the invention may be capable of obtaining the optical states of any number of devices without departing from the invention. FIGS. 2.6-2.7 show diagrams that illustrate examples of such embodiments.

FIG. 2.6 shows a fourth cross section diagram of the second data processing device in accordance with one or more embodiments of the invention. The cross-section diagram of FIG. 2.6 may be similar to that of FIG. 2.5, but includes an optical state detector that includes multiple optical collectors.

For example, the controller (262) of the optical state detector may be operably connected to a first optical collector (276) and a second optical collector (278). The aforementioned optical collectors may facilitate obtaining of first optical radiation (272) for a first device and second optical radiation (274) from a device. By doing so, the optical state detector may be able to simultaneously obtain optical state information for multiple devices.

FIG. 2.7 shows a fourth cross section diagram of the second data processing device in accordance with one or more embodiments of the invention. The cross-section diagram of FIG. 2.7 may be similar to that of FIG. 2.5, but includes an optical state detector that includes a multiple-optical pickup optical collector (280).

The multiple-optical pickup optical collector (280) may be an optical collector that includes multiple optical pickups. Each of the multiple optical pickups may obtain optical radiation from corresponding devices. For example, a first optical pickup may obtain the first optical radiation (272) and a second optical pickup the obtain the second optical radiation (274). Each of the optical pickups may provide optical patterns to corresponding optical fibers disposed in the extension (264). By doing so, the optical state detector may be able to simultaneously obtain optical state information for multiple devices.

To provide the above-noted functionality of an optical state detector, a data processing device in accordance with one or more embodiments of the invention may perform all or a portion of the method illustrated in FIG. 3. The method illustrated in FIG. 3 may be used to operate a device based on optical state information of the device.

FIG. 3 shows a flowchart of a method in accordance with one or more embodiments of the invention. The method depicted in FIG. 3 may be used to manage a device disposed in a data processing device in accordance with one or more embodiments of the invention. The method shown in FIG. 3 may be performed completely, or in part, by, for example, data processing devices (e.g., 102, FIG. 1.1). Other components of the system illustrated in FIG. 1.1 may perform all, or a portion, of the method of FIG. 3 without departing from the invention.

While FIG. 3 is illustrated as a series of steps, any of the steps may be omitted, performed in a different order, additional steps may be included, and/or any or all of the steps may be performed in a parallel and/or partially overlapping manner without departing from the invention.

In step 300, performance of a function of the device is initiated.

In one or more embodiments of the invention, the function of the device is initiated by sending a message to the device requesting performance of the function. The message may specify, for example, the function to be performed, a duration for performing the function, parameters for performing the function, and/or other types of information that facilitate performance of the function by the device. In response to receiving the message, the device may perform the requested function.

In one or more embodiments of the invention, the device is an electromagnetic interference emitting device. For example, the device may be a cell phone disposed in an internal volume of the data processing device that is adapted to suppress electromagnetic interference emitted by the cell phone.

In step 302, electromagnetic radiation from the device is obtained after initiating the performance. In one or more embodiments of the invention, electromagnetic radiation is obtained using an optical state detector. For example, the electromagnetic radiation may be obtained by obtaining an optical pattern from the device. The optical pattern may be obtained using an optical pickup In one or more embodiments of the invention, the optical pattern is light emitted from the display of the device. Optical pattern may be light emitted from other portions of the device without departing from the invention.

In one or more embodiments of the invention, the optical pattern is transmitted through a boundary of an internal volume of the data processing device that suppresses electromagnetic interference to obtain electromagnetic radiation. For example, a portion of the optical state detector may be disposed through the boundary of the internal volume. The portion may be, for example, an optical fiber.

In one or more embodiments of the invention, the optical state detector is used by sending one or more messages to the optical state detector. The message may request that the optical state detector perform one or more of its functions. For example, the computing device may send a message to the optical state detector requesting of the optical state detector obtain an optical state of the device. To do so, optical state detector may obtain the electromagnetic radiation.

In one or more embodiments of the invention, electromagnetic radiation is light from the device. All or a portion of the light may be generated by the device. All or a portion of the light may be light reflected off of the device.

In step 304, it is determined whether electromagnetic radiation indicates that the device performed the function.

In one or more embodiments of the invention, the determination is based on an optical state of the device. The optical state of the device may be based on the electromagnetic radiation obtained in step 302. For example, the electromagnetic radiation may be transmitted to a collector of the optical state detector. Once transmitted to the optical state detector, an image sensor may generate an image based on the electromagnetic radiation (e.g., light) as the optical state of the device.

In one or more embodiments of the invention, the optical state of the device is used to determine an operational state of the device to determine whether the device performs the function. For example, performance of the function may be associated with the predetermined optical state of the device. If the optical state obtained from the device does not match the predetermined optical state, it may be determined that the device did not perform the function. If the optical state obtained from the device does match the predetermined state, it may be determined that device did perform the function.

If it is determined that the device performed the function, the method may proceed to step 306. If it is determined that the device did not perform the function, the method may proceed to step 308.

In step 306, a first action set is performed based on the performance of the function. In other words, the computing device orchestrating operation of the device may perform first action set when it is determined that the device performed the function.

In one or more embodiments of the invention, the first action set is at least one action to be performed when the device performs the function. For example, the at least one action may be to perform a different function. The at least one action may be other types of actions without departing from the invention.

The method may end following step 306.

Returning to step 304, the method may proceed to step 308 if the device did not perform the function.

In step 308, a section action set is performed based on the nonperformance of the function. In other words, the computing device orchestrating operation of the device may perform a second action set when it is determined that the device did not perform the function.

In one or more embodiments of the invention, the second action set is at least one action to be performed when the device does not perform the function. For example, the at least one action may be to repeat performance of the function. The at least one action may be other types of actions without departing from the invention.

The method may end following step 308.

Thus, via the method illustrated in FIG. 3, optical state information from electromagnetic interference emitting devices (and/or other types of devices) may be utilized to control the operation of the electromagnetic interference emitting devices.

To further clarify embodiments of the invention, a non-limiting example is provided in FIGS. 4.1-4.2. Each of these figures may illustrate a system similar to that of FIG. 1.1 and/or actions performed by the system at different points in times. For the sake of brevity, only a limited number of components of the system of FIG. 1 are illustrated in each of FIGS. 4.1-4.2.

EXAMPLE

Consider a scenario as illustrated in FIG. 4.1 in which a device (402) is disposed in a data processing device. The data processing device may include a computing device (404) that is orchestrating the operation of the device (402) and an optical state detector (400) that is monitoring the optical state of the device (402).

FIG. 4.2 shows a diagram of actions performed by the aforementioned entities over a period of time. At a first point in time, the computing device (404) sends a message requesting that the device (402) display a first picture (420). In response to receiving the message, the device (402) identifies the first picture in its persistent storage and displays the first picture on its display. To do so, the device (402) modifies the display to show the first picture (422). For example, the device (402) may change the color and/or intensity of light emitted by pixels of the display to cause the display to present representation of the first picture.

However, due to an unexpected occurrence with respect to the operation of the device (402), the color of the light emitted by the pixels of the display does not correspond to the first picture (420). Thus, the optical state of the device (402) differs from the predetermined optical state of the device (402) when the display of the device (402) emits light of any color and intensity corresponding to the first picture (420).

While the device (402) displays the first picture, the optical state detector (400) obtains light from the display (424). To do so, the optical state detector (400) obtains light emitted by the display while the first picture is being displayed. The light is transmitted to a controller of the optical state detector (400) through boundary of an internal volume that electromagnetically isolates the device (402) from the optical state detector (400), the computing device (404), and/or other devices (not shown).

Using the obtained light from the display, the optical state detector (400) generates an image based on the light. For example, the light may be directed onto an image sensor such as a charge coupled device. In response to receiving the light, the image sensor may generate a digital representation of the light. By doing so, the generated image based on the light may represent an optical state of the device (402). For example, the image may reflect the light emitted from the display of the device (402).

After generating the image, the optical state detector (400) provides the image based on the light (426) to the computing device (404). By doing so, the computing device (404) may be informed of optical state of the device (402).

Using the image, the computing device (404) identifies a difference between the first picture in the image (428). As noted above, due to the unexpected occurrence, the optical state of the device (402) displaying the first picture (422) did not correspond to the predetermined optical state associated with the first picture (420).

Because the computing device (404) identify the difference between the first picture in the image (428), the computing device (404) determines that a second action set associated with improper operation of the device (402) should be performed. The second action set includes display of a second picture (430) by the device (402). To cause the device (402) to display the second picture (430), the computing device (404) sends a request to the device (402) to display the second picture (430).

End of Example

Thus, as illustrated by the example described with respect to FIGS. 4.1-4.2, the data processing device in accordance with one or more embodiments of the invention may utilize the optical states devices disposed within the computing device to determine functionality of the devices to invoke. By doing so, the data processing device may more accurately determine an operational state of the devices and, consequently, more effectively invoke the functionality of the devices for a predetermined purpose.

Figure 5:
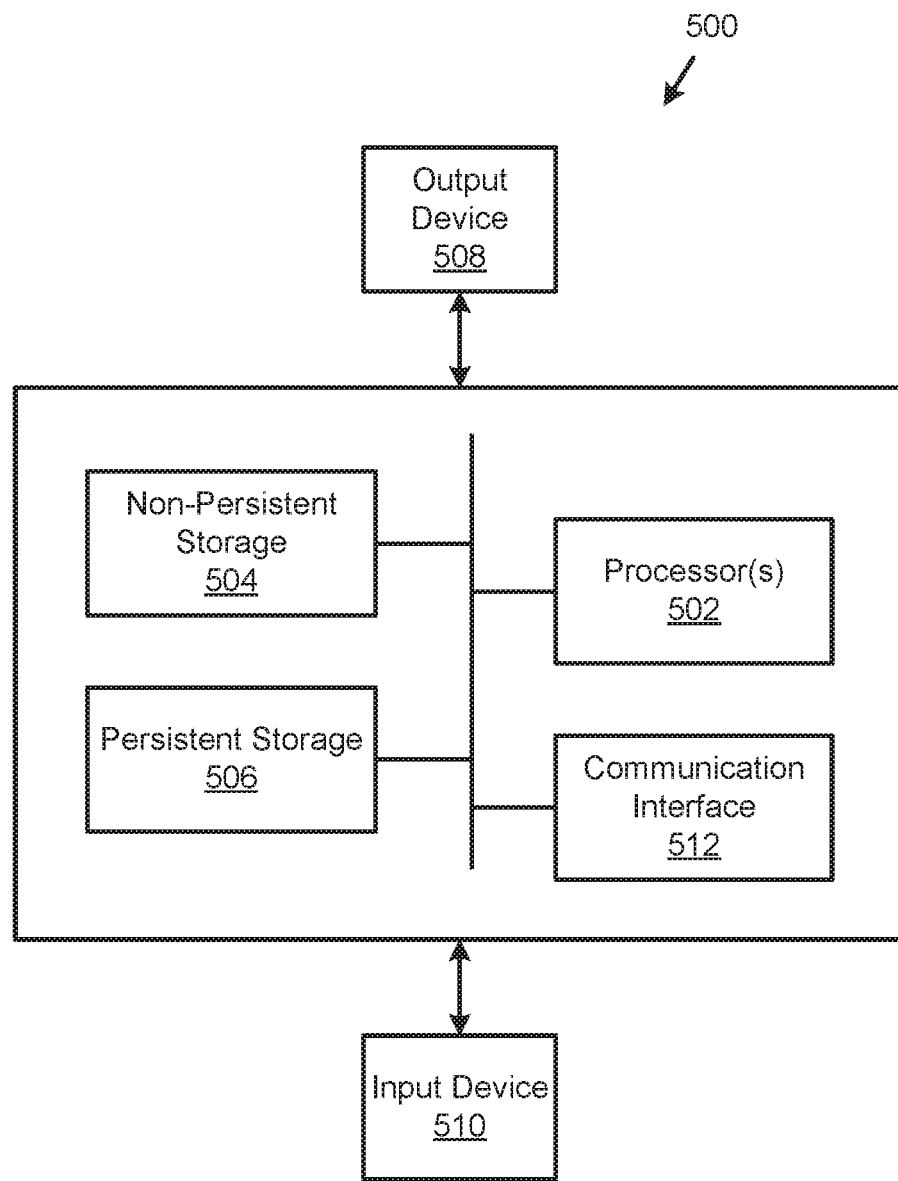
FIG. 5 shows a diagram of a computing device in accordance with one or more embodiments of the invention.

As discussed above, embodiments of the invention may be implemented using computing devices. FIG. 5 shows a diagram of a computing device in accordance with one or more embodiments of the invention. The computing device (500) may include one or more computer processors (502), non-persistent storage (504) (e.g., volatile memory, such as random access memory (RAM), cache memory), persistent storage (506) (e.g., a hard disk, an optical drive such as a compact disk (CD) drive or digital versatile disk (DVD) drive, a flash memory, etc.), a communication interface (512) (e.g., Bluetooth interface, infrared interface, network interface, optical interface, etc.), input devices (510), output devices (508), and numerous other elements (not shown) and functionalities. Each of these components is described below.

In one embodiment of the invention, the computer processor(s) (502) may be an integrated circuit for processing instructions. For example, the computer processor(s) may be one or more cores or micro-cores of a processor. The computing device (500) may also include one or more input devices (510), such as a touchscreen, keyboard, mouse, microphone, touchpad, electronic pen, or any other type of input device. Further, the communication interface (512) may include an integrated circuit for connecting the computing device (500) to a network (not shown) (e.g., a local area network (LAN), a wide area network (WAN) such as the Internet, mobile network, or any other type of network) and/or to another device, such as another computing device.

In one embodiment of the invention, the computing device (500) may include one or more output devices (508), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (502), non-persistent storage (504), and persistent storage (506). Many different types of computing devices exist, and the aforementioned input and output device(s) may take other forms.

Embodiments of the invention may provide a method, system, and device for managing electromagnetic interference. A system in accordance with embodiments of the invention may manage electromagnetic interference at a data processing device level. That is, such devices may include functionality to limit the propagation of electromagnetic interference from within data processing devices to an ambient environment surrounding the data processing device. By doing so, such data processing devices may be used in a high-density environment without negatively impacting the functionality of the high-density environment.

A data processing device in accordance with embodiments of the invention may enable the optical states of devices disposed within the data processing device to be determined while suppressing electromagnetic interference generated by the devices. To do so, the data processing device may include an optical state detector that obtains optical states of the devices. To obtain the optical states the devices, optical state detector may obtain optical radiation from the devices, transmit the optical radiation through boundary of an internal volume in which the devices are disposed, and generate the optical states of the devices based on the optical radiation. Such information may be used to more effectively control the operation of the devices by determining an operational state of the devices with a higher degree of accuracy in determining the operational state of the devices without having access to optical state information associated with the devices.

Thus, embodiments of the invention may address the problem electromagnetic interference within a high-density environment. Specifically, embodiments of the invention may provide a data processing device level solution that facilitates granular control of electromagnetic interference in the aforementioned environments while also enabling optical state information for the aforementioned devices to be obtained.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A data processing device, comprising:
   an internal volume that is electromagnetic interference (EMI) isolated; and
   an optical state detector adapted to:
      obtain electromagnetic radiation from the internal volume while the internal volume is EMI isolated; and
      make a determination that a device disposed in the internal volume has an optical state associated with the electromagnetic radiation.

2. The data processing device of claim 1, wherein the optical state detector is adapted to obtain the electromagnetic radiation while a first portion of the optical state detector is disposed outside of the internal volume and a second portion of the optical state detector is disposed inside of the internal volume.

3. The data processing device of claim 2, wherein the first portion and the second portion are physically connected by a third portion that traverses a boundary of the internal volume.

4. The data processing device of claim 1, wherein the optical state is associated with a pattern of light emitted by the device.

5. The data processing device of claim 4, wherein the pattern of the light is emitted by a display of the device.

6. The data processing device of claim 4, wherein the optical state is associated with performance of a function of the device.

7. The data processing device of claim 1, further comprising:
   a computing device programmed to:
      initiate performance of a function of the device;
      obtain, using the optical state detector, the optical state;
      make a second determination that the optical state indicates that the device performed the function of the device in a predetermined manner; and
      perform a first action set based on the second determination.

8. The data processing device of claim 7, wherein the computing device is further programmed to:
   initiate performance of a second function of the device;
   obtain, using the optical state detector, a second optical state of the device after initiating performance of the second function;
   make a third determination that the second optical state indicates that the device performed the second function of the device in a non-predetermined manner; and
   perform a second action set based on the third determination.

9. The data processing device of claim 7, wherein the optical state is obtained using an image of the device provided by the optical state detector.

10. The data processing device of claim 9, wherein the image comprises a representation of a display of the device.

11. The data processing device of claim 1, wherein the optical state detector comprises:
- an optical collector; and
- a controller adapted to receive the electromagnetic radiation via the optical collector.

12. The data processing device of claim 11, wherein the optical collector comprises:
- an optical pickup adapted to obtain the electromagnetic radiation; and
- an extension adapted to:
  - traverse a boundary of the internal volume; and
  - suppress transmission of EMI through the boundary.

13. The data processing device of claim 12, wherein the extension does not comprise electrically conductive material.

14. The data processing device of claim 12, wherein the extension does not comprise metal.

15. The data processing device of claim 12, wherein the extension comprises an optical fiber.

16. The data processing device of claim 15, wherein the optical fiber is operably coupled to the optical pickup and the controller.

* * * * *